United States Patent
Park et al.

(10) Patent No.: US 11,741,596 B2
(45) Date of Patent: Aug. 29, 2023

(54) SEMICONDUCTOR WAFER FAULT ANALYSIS SYSTEM AND OPERATION METHOD THEREOF

(71) Applicant: SAMSUNG ELECTRONICS CO., LTD., Suwon-si (KR)

(72) Inventors: Min-Chul Park, Hwaseong-si (KR); Ami Ma, Suwon-si (KR); Jisu Ryu, Hwaseong-si (KR); Changwook Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 984 days.

(21) Appl. No.: 16/599,733

(22) Filed: Oct. 11, 2019

(65) Prior Publication Data
US 2020/0175665 A1    Jun. 4, 2020

(30) Foreign Application Priority Data
Dec. 3, 2018 (KR) .......................... 10-2018-0153781

(51) Int. Cl.
*G06K 9/00* (2022.01)
*G06T 7/00* (2017.01)
(Continued)

(52) U.S. Cl.
CPC .......... *G06T 7/001* (2013.01); *G01N 21/8851* (2013.01); *G01N 21/9501* (2013.01);
(Continued)

(58) Field of Classification Search
CPC .......... G06T 5/001; G06T 5/002; G06T 5/003; G06T 5/50; G06T 7/0002; G06T 7/0004;
(Continued)

(56) References Cited

U.S. PATENT DOCUMENTS 5,787,190 A    7/1998  Peng et al.
8,041,541 B2  10/2011  Buxton et al.
(Continued)

FOREIGN PATENT DOCUMENTS

KR    10-2018-0084576 A    7/2018

OTHER PUBLICATIONS

S. Song, et al., "An Accurate Hybrid-Similarity Technique for User-Defined Wafer Fail-Map Pattern Detection", Proceedings of the World Congress on Engineering and Computer Science, 2013, vol. II.
(Continued)

*Primary Examiner* — Eric Rush
(74) *Attorney, Agent, or Firm* — Lee IP Law, P.C.

(57) ABSTRACT

A semiconductor wafer fault analysis system includes: a database to store a first reference map, which is classified as a first fault type, and a second reference map, which is classified as a second fault type; a first auto-encoder/decoder to remove a noise corresponding to the first fault type from the first reference map to generate a first pre-processed reference map; a second auto-encoder/decoder to remove a noise corresponding to the second fault type from the second reference map to generate a second pre-processed reference map; and a fault type analyzer. The database is updated based on the first and second pre-processed reference maps, and the fault type analyzer is to classify a fault type of a target map based on the updated database. The target map is generated by measuring a target wafer.

18 Claims, 16 Drawing Sheets

(51) Int. Cl.
*H01L 21/67* (2006.01)
*G01N 21/956* (2006.01)
*G01N 21/95* (2006.01)
*G06T 5/00* (2006.01)
*G01N 21/88* (2006.01)
*G06V 10/70* (2022.01)
*G06V 10/82* (2022.01)
*G06V 10/74* (2022.01)

(52) U.S. Cl.
CPC ....... *G01N 21/95607* (2013.01); *G06T 5/002* (2013.01); *G06T 7/0004* (2013.01); *G06V 10/70* (2022.01); *G06V 10/74* (2022.01); *G06V 10/82* (2022.01); *H01L 21/67288* (2013.01); *G01N 2021/8854* (2013.01); *G01N 2021/8867* (2013.01); *G01N 2021/95615* (2013.01); *G06T 2207/20081* (2013.01); *G06T 2207/30141* (2013.01); *G06T 2207/30148* (2013.01)

(58) Field of Classification Search
CPC ..... G06T 7/0006; G06T 7/0008; G06T 7/001; G06T 7/60; G06T 7/70; G06T 7/97; G06T 2207/20081; G06T 2207/20084; G06T 2207/30141; G06T 2207/30148; G06T 2207/30152; G01N 21/88; G01N 21/8803; G01N 21/8851; G01N 21/94; G01N 21/9501; G01N 21/9503; G01N 21/9505; G01N 21/956; G01N 21/95607; G01N 21/95623; G01N 2021/8854; G01N 2021/8861; G01N 2021/8867; G01N 2021/8887; G01N 2021/95615; G01N 2021/9563; G01N 2021/95676; G06Q 50/04; H01L 21/67288; H01L 22/12; H01L 22/22; H01L 22/30; G06V 10/20; G06V 10/28; G06V 10/30; G06V 10/36; G06V 10/42; G06V 10/44; G06V 10/443; G06V 10/48; G06V 10/70; G06V 10/72; G06V 10/74; G06V 10/755; G06V 10/77; G06V 10/7715; G06V 10/82; G05B 2219/31356; G05B 2219/32186; G05B 2219/32187; G05B 2219/32193; G05B 2219/32222; G05B 2219/32334; G05B 2219/32335; G05B 2219/37224
USPC ........ 382/100, 141, 144–150, 152, 155–160, 382/181, 190, 199, 209, 215–220, 224, 382/225, 254–258, 260–264, 266, 275, 382/278; 438/16; 356/237.1, 237.2, 356/237.3, 237.4, 237.5, 239.3, 239.7, 356/239.8, 394; 700/95, 108–110, 121; 702/33–36, 81–84, 185, 189–195

See application file for complete search history.

(56) References Cited

U.S. PATENT DOCUMENTS

| | | | |
|---|---|---|---|
| 9,778,206 B2 | 10/2017 | Honda et al. | |
| 10,181,185 B2* | 1/2019 | Park | G06T 7/001 |
| 10,579,923 B2* | 3/2020 | Munawar | G06N 3/045 |
| 10,634,621 B2* | 4/2020 | Kano | G06T 7/0004 |
| 2004/0218806 A1* | 11/2004 | Miyamoto | G06K 9/6253 |
| | | | 382/145 |
| 2008/0187212 A1 | 8/2008 | Obara et al. | |
| 2015/0046121 A1 | 2/2015 | Dziura et al. | |
| 2016/0098633 A1 | 4/2016 | Min | |
| 2016/0163035 A1* | 6/2016 | Chang | G06T 7/0004 |
| | | | 382/149 |
| 2017/0192411 A1* | 7/2017 | Ghadar | G06N 20/00 |
| 2017/0351952 A1 | 12/2017 | Zhang et al. | |
| 2017/0356853 A1 | 12/2017 | Sapiens et al. | |
| 2018/0121626 A1* | 5/2018 | Abedini | G16H 50/30 |
| 2018/0144182 A1 | 5/2018 | El-Zehiry et al. | |
| 2018/0159879 A1 | 6/2018 | Mestha et al. | |
| 2019/0294923 A1* | 9/2019 | Riley | G06K 9/6267 |
| 2019/0325299 A1* | 10/2019 | Oliveira Pinheiro | |
| | | | G06T 7/0002 |
| 2020/0074247 A1* | 3/2020 | Dubovsky | G06V 10/764 |
| 2021/0209410 A1* | 7/2021 | Pan | G06V 10/82 |

OTHER PUBLICATIONS

C. J. Huang, "Image Processing Techniques for Wafer Defect Cluster Identification", IEEE, 2002.

* cited by examiner

SEMICONDUCTOR WAFER FAULT ANALYSIS SYSTEM AND OPERATION METHOD THEREOF

CROSS-REFERENCE TO RELATED APPLICATION

Korean Patent Application No. 10-2018-0153781, filed on Dec. 3, 2018, in the Korean Intellectual Property Office, and entitled: "Semiconductor Wafer Fault Analysis System and Operation Method Thereof," is incorporated by reference herein in its entirety.

BACKGROUND

1. Field

Embodiments relate to a semiconductor fault analysis, and more particularly, relate to a semiconductor wafer fault analysis system and an operation method thereof.

2. Description of the Related Art

A semiconductor device is manufactured through various processes. As semiconductor design technologies develop, the number of processes for manufacturing a semiconductor device, process complexity and an integration density of the semiconductor device have been increased. Thus, various defects or faults may occur in the processes for manufacturing the semiconductor device.

To verify and calibrate a semiconductor fault or a cause of the semiconductor fault, it may be necessary to detect a fault on a semiconductor wafer and to classify a fault type of the detected fault. For example, a fault type of a semiconductor wafer may be classified by the following: 1) comparing reference maps, which are classified in advance into specific fault types, and a map, which is generated by measuring the semiconductor wafer, 2) selecting the most similar reference map to the map, and 3) classifying the fault type of the semiconductor wafer as the selected most similar reference map. However, when the reference maps do not have the sufficient number or the reference maps include various noises, reliability of the reference maps becomes low such that it is difficult to accurately classify the fault type of the semiconductor wafer.

SUMMARY

Embodiments are directed to a semiconductor wafer fault analysis system including: a database to store a first reference map, which is classified as a first fault type, and a second reference map, which is classified as a second fault type; a first auto-encoder/decoder to remove a noise corresponding to the first fault type from the first reference map to generate a first pre-processed reference map; a second auto-encoder/decoder to remove a noise corresponding to the second fault type from the second reference map to generate a second pre-processed reference map; and a fault type analyzer. The database may be updated based on the first and second pre-processed reference maps, and the fault type analyzer may be to classify a fault type of a target map based on the updated database. The target map may be generated by measuring a target wafer.

Embodiments are directed to a semiconductor wafer fault analysis system including: a database including a first reference map that is classified as a first fault type and a second reference map that is classified as a second fault type; a measurer to generate a target map by measuring a target semiconductor wafer; and a fault type analyzer to classify a fault type of the target map based on the first reference map and the second reference map in the database. The fault type analyzer may include: a pre-processer to perform a first pre-processing operation on the first reference map by using information of the first fault type to generate one or more first pre-processed reference maps and to perform a second pre-processing operation on the second reference map by using information about the second fault type to generate one or more second pre-processed reference maps; and a fault classificator to classify the fault type of the target map by comparing the target map with each of the one or more first pre-processed reference maps and the one or more second pre-processed reference maps.

Embodiments are directed to an operation method of a semiconductor wafer fault analysis system including: performing a first pre-processing operation on a first reference map, which is classified as a first fault type, based on information of the first fault type to generate one or more first pre-processed reference maps; performing a second pre-processing operation on a second reference map, which is classified as a second fault type, based on information of the second fault type to generate one or more second pre-processed reference maps; generating a target map by measuring a target semiconductor wafer; classifying a fault type of the target map based on the first reference map, the second reference map, the one or more first pre-processed reference maps, and the one or more second pre-processed reference maps; and outputting information of the classified fault type of the target map. The first pre-processing operation may be performed by a first auto-encoder/decoder, and the second pre-processing operation may be performed by a second auto-encoder/decoder different from the first auto-encoder/decoder.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Embodiments may be described in detail and clearly to such an extent that an ordinary one in the art easily implements the embodiments.

Below, the terms "map", "reference map", etc. are used to describe exemplary embodiments briefly and clearly. The term "map" used in the specification may indicate data or information of the form of an image including various information measured from a semiconductor wafer. One map may be information corresponding to one semiconductor wafer. That is, one map may be generated based on a result of various tests associated with one semiconductor wafer. The term "map" used in the specification may be interchangeably used with the terms "image map", "wafer map", etc.

The term "reference map" used in the specification may be a map classified as a specific fault type among maps and may indicate data or information used as a reference of comparison with a target map in a semiconductor wafer fault analysis. That is, the reference map may include maps, in which a fault is included, from among maps measured from various semiconductor wafers. The reference map may be managed together with information about a relevant fault type.

In the following description, a database which is managed or generated by a reference map database managing device (hereinafter referred to as a "database managing device") may be used to perform a semiconductor wafer fault analysis. For example, a database may include one or more reference maps associated with various fault types of a semiconductor wafer and may be used to classify or analyze a fault type corresponding to a target map by detecting a reference map matched with or the most similar to the target map in the semiconductor wafer fault analysis.

In an exemplary embodiment, because the reference map is composed of maps, in which a fault type is included, from among maps measured from various semiconductor wafers, the reference map may include any other noises as well as a specific fault type. This may cause a decrease in accuracy and reliability in the semiconductor wafer fault analysis.

Figure 1:
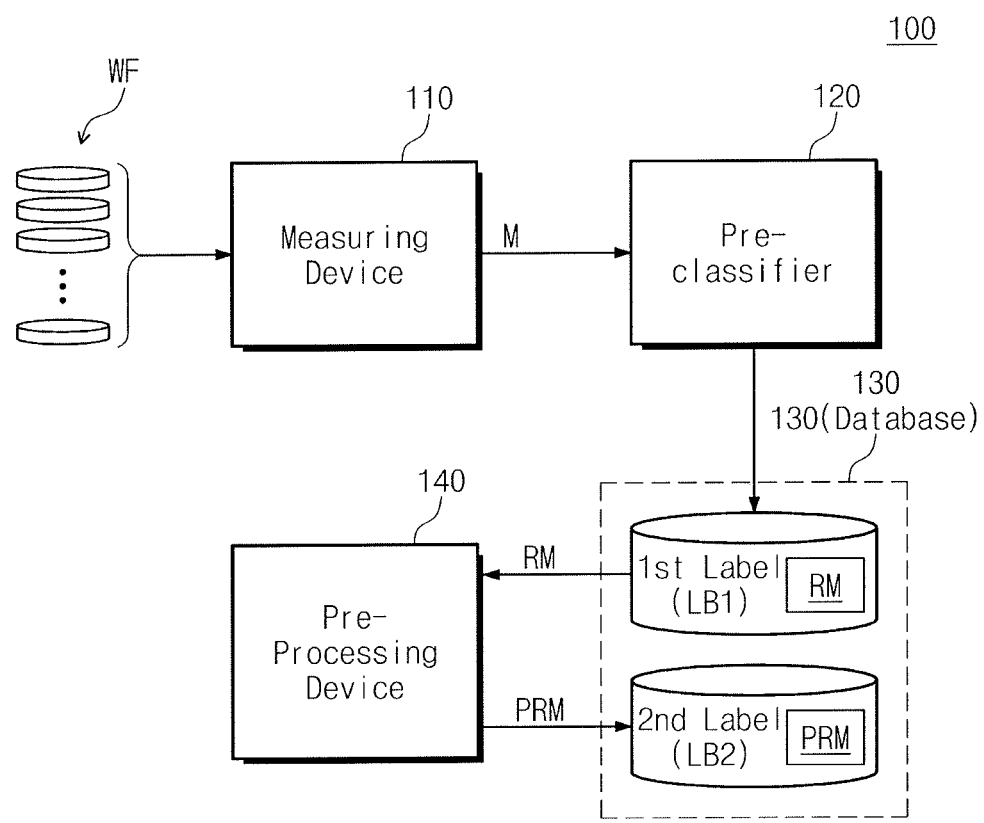
FIG. 1 illustrates a database managing device that is configured to manage a database for a semiconductor wafer fault analysis according to an exemplary embodiment.

FIG. 1 illustrates a database managing device that is configured to manage a database for a semiconductor wafer fault analysis according to an exemplary embodiment. Referring to FIG. 1, a database managing device 100 may include a measuring device 110, a pre-classifier 120, a database 130, and a pre-processing device 140.

The measuring device 110 may generate a plurality of maps "M" that are respectively associated with a plurality of semiconductor wafers WF. Each map "M" indicates information or data obtained by converting results of various test operations for one semiconductor wafer into an image form. For example, an area of the semiconductor wafer WF, which is determined to include a fault or a defect, may be expressed in a corresponding area of each map "M" in the form of a specific value or a specific shape.

The semiconductor wafer WF may be used as a semiconductor substrate. For example, the semiconductor wafer WF may include a material having a semiconductor characteristic, e.g., silicon (Si) or gallium arsenic (GaAs). The semiconductor wafer WF may include various semiconductor patterns that are formed through various processes.

The plurality of maps "M", which are obtained by measuring the plurality of semiconductor wafers WF with the measuring device 110, may be provided to the pre-classifier 120. The pre-classifier 120 may classify the plurality of maps "M" according to fault types thereof. For example, the pre-classifier 120 may identify the fault types of the plurality of maps "M" and may determine to which group each map "M" belongs, based on the identified fault type thereof.

The plurality of maps "M" may be stored in a first label LB1 of the database 130 together with information of the fault types, based on the identified fault type of each map "M". For example, the first label LB1 may include a plurality of reference maps RM and information of a fault type of each reference map RM. In an example embodiment, the database 130 may include a computing device or a high-capacity storage medium that is configured to store and manage various data.

In an example embodiment, exemplary configurations and exemplary operations of the measuring device 110, the pre-classifier 120, and the first label LB1 of the database 130 are described. For example, a fault detecting operation and a fault type analyzing operation, which are associated with a plurality of maps, may be performed in advance through a previous semiconductor wafer fault analysis operation. A plurality of maps, which are classified as a specific fault type in the previous semiconductor wafer fault analysis operation, may be stored in the first label LB1 as the reference maps RM together with information of respective fault types. For example, the first label LB1 may include the reference maps RM obtained in advance and information of fault types of the reference maps RM.

For example, the pre-processing device 140 may perform a pre-processing operation on the plurality of reference maps RM stored in the first label LB1 to generate pre-processed reference maps PRM. The pre-processed reference maps PRM may be stored in a second label LB2 of the database 130.

In an exemplary embodiment, the pre-processed reference maps PRM may have more improved accuracy or reliability than the reference maps RM. When the pre-processed reference maps PRM having the more improved accuracy or reliability are used in a semiconductor fault type analysis operation, accuracy and reliability of the semiconductor fault type analysis operation may be improved. Thus, results of the semiconductor fault type analysis operation, which is performed with the pre-processed reference maps PRM, may be more reliable and accurate compared with when the semiconductor fault type analysis operation is performed with the plurality of reference maps RM.

For example, a pre-processing operation may include a de-noising operation for reducing a noise of each of the reference maps RM and an augmenting or expanding operation for augmenting or expanding information of the reference maps RM. For example, a noise level in each of the pre-processed reference maps PRM may be lower than that in each of the reference maps RM. Alternatively, each of the pre-processed reference maps PRM may include more information than each of the reference maps RM. For example, the number of the pre-processed reference maps PRM, which are associated with a specific fault type, may be greater than the number of the reference maps RM, which are associated with the specific fault type. Thus, reliability and accuracy of the semiconductor wafer fault analysis operation may be improved. A pre-processing operation according to an exemplary embodiment will be more fully described with reference to drawings below.

As described above, a database managing device for a semiconductor wafer fault analysis according to an exemplary embodiment may perform a pre-processing operation on reference maps to generate pre-processed reference maps. As a semiconductor wafer fault analysis is performed by using pre-processed reference maps, accuracy and reliability of a fault analysis operation may be improved.

Figure 2:
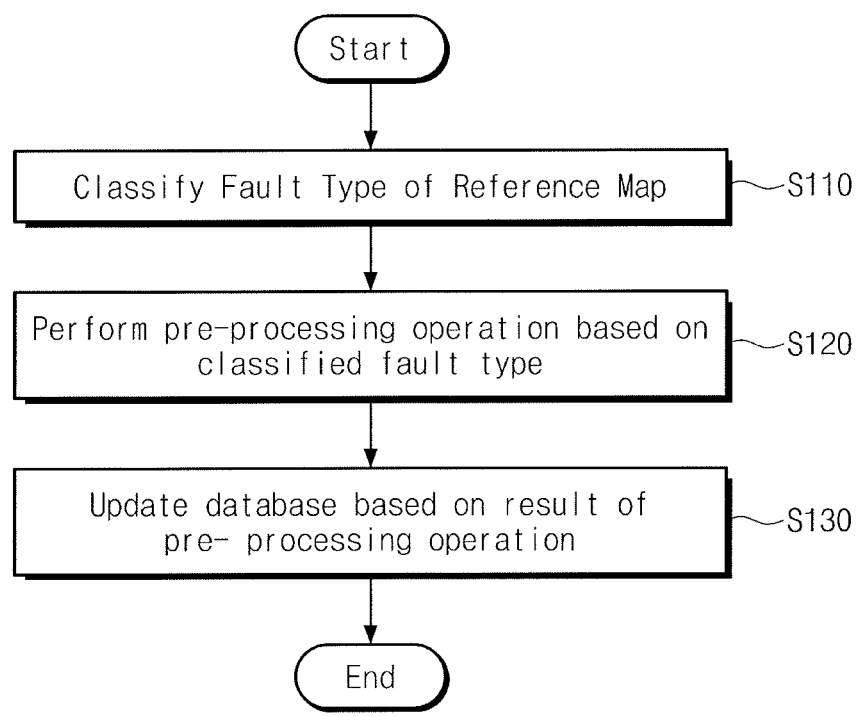
FIG. 2 illustrates an operation of a database managing device of FIG. 1.

FIG. 2 illustrates an operation of a database managing device of FIG. 1. Referring to FIGS. 1 and 2, in operation S110, the database managing device 100 may classify a fault type of a reference map. For example, a map among the plurality of maps "M", which are measured by the measuring device 110, may be used as a reference map, when the map is determined as being measured from a defective semiconductor wafer or when the map is determined as including a fault. For example, the reference map may indicate a physical fault or defect of a semiconductor wafer in an image form. The pre-classifier 120 may classify a fault type of the reference map. The reference map may be stored in the first label LB1 of the database 130 together with information of the classified fault type.

In an example embodiment, the reference map and the information of the fault type of the reference map stored in the first label LB1 may be generated or formed prior to a previous semiconductor wafer fault analysis operation.

In operation S120, the database managing device 100 may perform a pre-processing operation based on the classified fault type of the reference map. For example, the pre-processing device 140 of the database managing device 100 may perform the de-noising operation on the reference map based on the fault type thereof. Alternatively, the pre-processing device 140 of the database managing device 100 may expand or augment the reference map based on the fault type of the reference map. The pre-processing operation associated with the reference map will be more fully described with reference to FIGS. 3 to 11.

In operation S130, the database managing device 100 may update the database 130 based on a result of the pre-processing operation, which is performed by the pre-processing device 140. For example, the database managing device 100 may store the result of the pre-processing operation in the second label LB2 of the database 130.

In an example embodiment, as the updated database 130 is used in the semiconductor wafer fault analysis, accuracy and reliability of the semiconductor wafer fault analysis may be improved.

Figure 3:
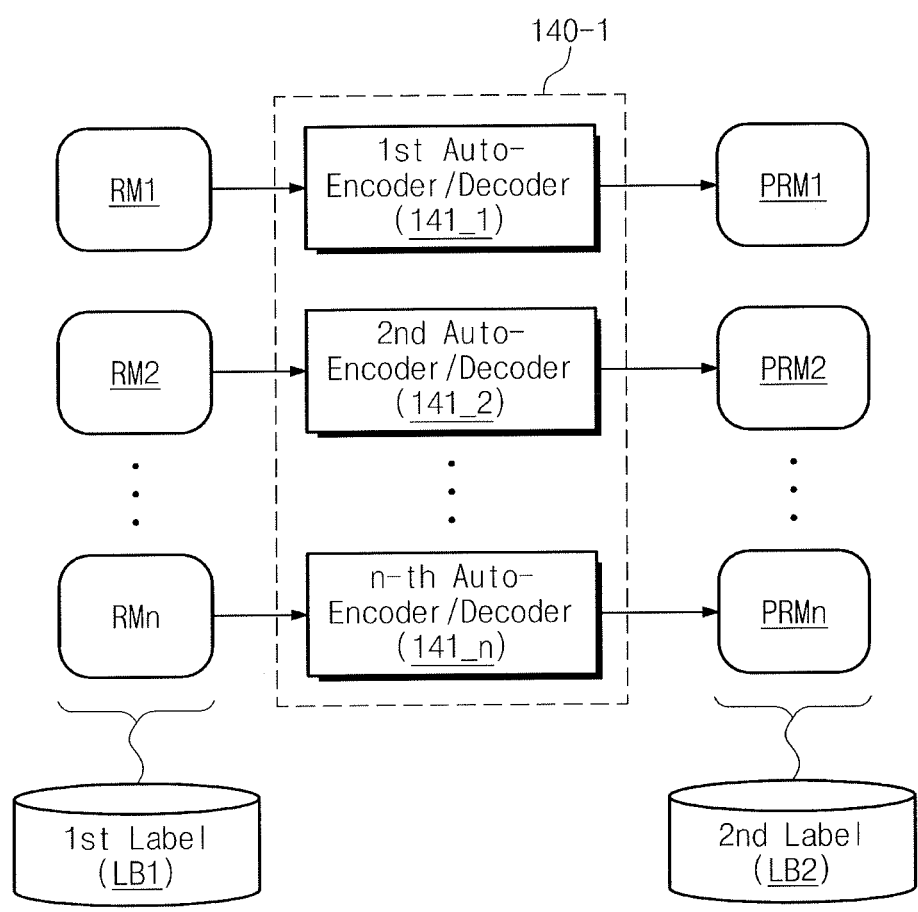
FIG. 3 illustrates a pre-processing device of FIG. 1.

FIG. 3 illustrates a pre-processing device of FIG. 1. Referring to FIG. 3, a pre-processing device 140-1 may include first to n-th auto-encoders/decoders 141_1 to 141_n. The first to n-th auto-encoders/decoders 141_1 to 141_n may perform the de-noising operation on first to n-th reference maps RM1 to RMn, respectively.

In an example embodiment, the first to n-th reference maps RM1 to RMn may be maps classified into different fault types, respectively. For example, the first reference map RM1 may be a first type reference map classified as a first fault type (e.g., a linear fault type). The second reference map RM2 may be a second type reference map classified as a second fault type (e.g., a random fault type). The n-th reference maps RMn may be a n-th type reference map classified as an n-th fault type (e.g., a ring fault type).

The first to n-th auto-encoders/decoders 141_1 to 141_n may perform the de-noising operation on different reference maps in different fault types, respectively. For example, the first auto-encoder/decoder 141_1 may perform the de-noising operation on the first reference map RM1, which is classified as the first fault type. Further, the first auto-encoder/decoder 141_1 may generate a first pre-processed reference map PRM1. The second auto-encoder/decoder 141_2 may perform the de-noising operation on the second reference map RM2, which is classified as the second fault type. Further, the second auto-encoder/decoder 141_2 may generate a second pre-processed reference map PRM2. As in the above description, the n-th auto-encoder/decoder 141_n may perform the de-noising operation on the n-th reference map RMn, which is classified as the n-th fault type. Further, the n-th auto-encoder/decoder 141_n may generate n-th pre-processed reference maps PRMn. In another embodiment, each of the first to n-th reference maps RM1 to RMn may be plural, and each of the first to n-th pre-processed reference maps RM1 to RMn may be plural.

As described above, information of a fault type may be accurately extracted by performing the de-noising operation on a reference map by using a different auto-encoder/decoder according to a fault type of the reference map.

In an exemplary embodiment, the first reference map RM1 may be a reference map of a linear fault type. The second reference map RM2 are a reference map of a random fault type. For example, when the de-noising operation is performed on both the first reference map RM1 and the second reference map RM2 by the same de-noising filter (e.g., a Gaussian filter as a random noise filter), information associated with the linear fault type may not be removed from the first reference map RM1 of the linear fault type, and information associated with the random fault type may be removed from the second reference map RM2 of the random fault type, because the information associated with the random fault type may be selectively filtered by the same de-noising filter (e.g., a Gaussian filter as a random noise filter). The Gaussian filter may be a low pass filter (LPF). Alternatively, when the de-noising operation is performed on both the first reference map RM1 and the second reference map RM2 by the same de-noising filter (e.g., a linear noise filter), information associated with the linear fault may be removed from the first reference map RM1 of the linear fault type, and information associated with the random fault may not be removed from the second reference map RM2 of the random fault type, because the information associated with the linear fault type may be selectively filtered by the same de-noising filter (e.g., a linear noise filter). In other words, when the same de-noising filter is applied to different type reference maps including different type faults, result values of the de-noising operation on the different type reference maps may include unnecessary information or may not include necessary information. Thus, when the same de-noising filter is applied to both the first reference map RM1 and the second reference map RM2 or when the same auto-encoder/decoder is applied to both the first reference map RM1 and the second reference map RM2, accuracy and reliability of the de-noised first and second reference maps RM1 and RM2 may be decreased, and thus, accuracy and reliability of a following semiconductor wafer fault analysis may be decreased.

In an exemplary embodiment, because the de-noising operation is performed by using a different auto-encoder/ decoder based on a fault type of each reference map, information of the corresponding fault type in each of pre-processed reference maps may not be removed during the de-noising operation, and each of the pre-processed reference may include the information of the corresponding fault type.

For example, the first auto-encoder/decoder 141_1 may perform the de-noising operation on first reference map RM1 of a first fault type. In this case, because the first auto-encoder/decoder 141_1 is trained based on information of the first fault type, the first auto-encoder/decoder 141_1 may extract information of the first fault type. For example, the second auto-encoder/decoder 141_2 may perform the de-noising operation on the second reference map RM2 of a second fault type. In this case, because the second auto-encoder/decoder 141_2 is trained based on information of the second fault type, the second auto-encoder/decoder 141_2 may extract the information of the second type fault.

Figure 4:
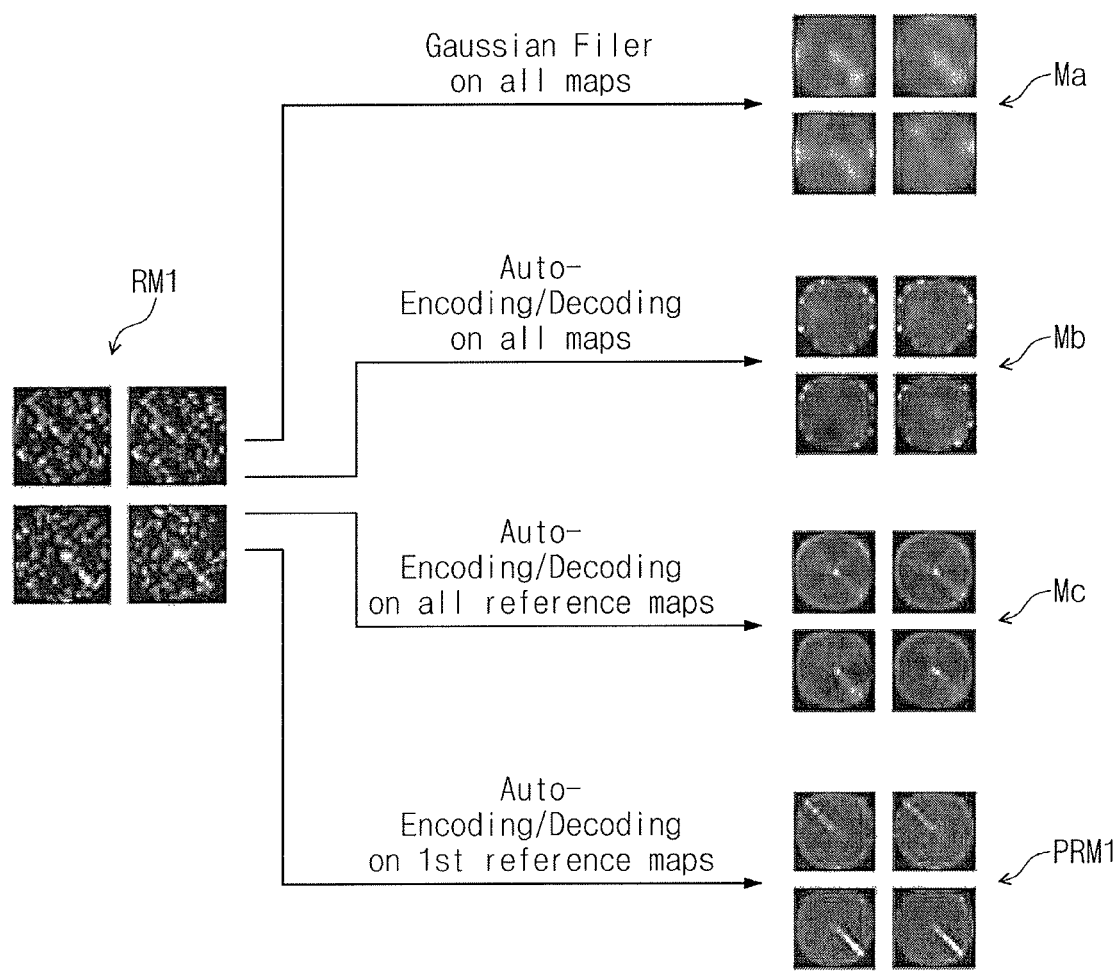
FIG. 4 illustrates an example for describing an operation of a pre-processing device of FIG. 3.

FIG. 4 illustrates an operation of a pre-processing device of FIG. 3. Referring to FIG. 4, first reference maps RM1 may include a linear fault. Thus, the first reference maps RM1 may be classified as a linear fault type.

First maps Ma of FIG. 4 show a result of the de-noising operation that is performed by applying the same Gaussian filter to all maps (i.e., all maps of all wafers regardless of a normal state or a faulty state). Second maps Mb of FIG. 4 show a result of the de-noising operation which is performed by applying the same auto-encoder/decoder to all maps. Third maps Mc of FIG. 4 show a result of the de-noising operation which is performed by applying the same auto-encoder/decoder to all reference maps (i.e., maps of defective wafers regardless of a fault type). First pre-processed reference maps PRM1 of FIG. 4 according to an exemplary embodiment show a result of the de-noising operation which is performed by applying the same auto-encoder/decoder 141_1 to the first reference maps RM1 that is classified as the first fault type.

As illustrated in FIG. 4, information associated with the linear fault type may be removed from the first to third maps Ma to Mc or may not be clearly expressed in the first to third maps Ma to Mc. For example, the first pre-processed reference maps PRM1 may clearly express information associated with the linear fault type compared with the first to third maps Ma to Mc. In other words, when the first pre-processed reference maps PRM1 are used as reference maps in the semiconductor wafer fault analysis, the accuracy to classify a linear fault type may be improved compared with when the first to third maps Ma to Mc are used as reference maps.

As described above, the pre-processing device 140 according to an exemplary embodiment may accurately extract information of respective fault types from reference maps by performing the de-noising operation on the reference maps with different auto-encoders/decoders based on the respective fault types of the reference maps.

Figure 5:
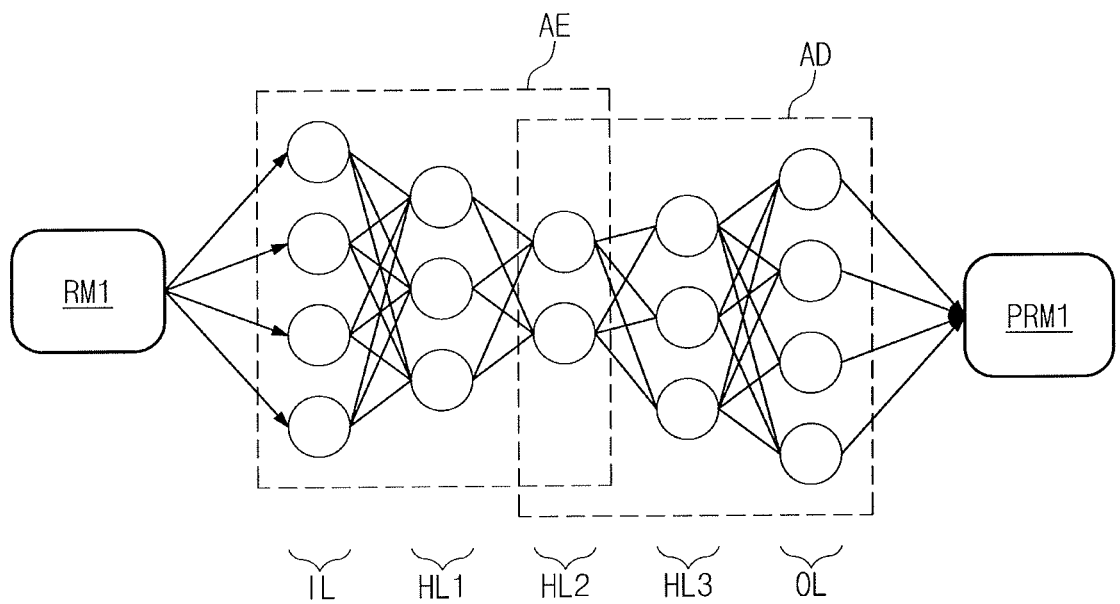
FIG. 5 illustrates a first auto-encoder/decoder of FIG. 3.

FIG. 5 illustrates a first auto-encoder/decoder of FIG. 3. Referring to FIGS. 3 and 5, the first auto-encoder/decoder 141_1 may include an auto-encoder AE and an auto-decoder AD.

The auto-encoder AE may receive the first reference map RM1 and may extract information of a fault type by performing encoding (or compression) on the first reference map RM1. For example, the auto-encoder AE may include an input layer IL and first and second hidden layers HL1 and HL2. The input layer IL may include input neurons, and the input neurons may receive corresponding values from the first reference map RM1. The input neurons are respectively connected with hidden neurons of the first hidden layer HL1.

In this case, a weight may be applied between neurons in the process of transferring information between the input layer IL and the first hidden layer HL1, and information of the first reference map RM1 may be encoded (or compressed) based on the weight. As in the above description, weights may be applied between neurons in the process of transferring information between the first hidden layer HL1 and the second hidden layer HL2. Finally, the auto-encoder AE may generate information which the first reference map RM1 is compressed.

The auto-decoder AD may decode the information the first reference map RM1 is compressed or generated by the auto-encoder AE. For example, the auto-decoder AD may include the second hidden layer HL2, a third hidden layer HL3, and an output layer OL. As in the above description, as weights are applied between hidden neurons between the second and third hidden layers HL2 and HL3 and weights are applied between hidden neurons of the third hidden layer HL3 and output neurons of the output layer OL, finally, the first pre-processed reference map PRM1 may be output. Compared with the first reference map RM1, the first pre-processed reference map PRM1 may have information of the first type fault without other information (e.g., a noise of the first type fault), which is removed through the encoding by the auto-encoder AE and the decoding by the auto-decoder AD. For example, a noise of the first type fault in the first reference map RM1 may be removed by encoding/decoding the first reference map RM1 through the auto-encoder/decoder 141_1, and the first type fault may be remained in the first pre-processed reference map PRM1. Alternatively, a feature associated with the first type fault may be extracted by encoding/decoding the first reference map RM1 through the auto-encoder/decoder 141_1.

In an example embodiment, weights, which are used in the first auto-encoder/decoder 141_1, may be adjusted through un-supervised learning. For example, the above weights may be learned or decided as the first auto-encoder/decoder 141_1 performs auto-encoding and auto-decoding on the first reference map RM1 classified as the first fault type. Thus, the first auto-encoder/decoder 141_1 may be configured to remove a noise of the first type fault from an input reference map (e.g., the first reference map RM1).

Although not illustrated in FIG. 5, the number of hidden layers in the first auto-encoder/decoder 141_1 may be variously changed. Also, the number of neurons included in the input layer IL, the hidden layers HL1, HL2, and HL3, and the output layer OL may be variously changed. Also, structures of the second to n-th auto-encoder/decoders 141_2 to 141_n of FIG. 3 may be similar to the structure of the first auto-encoder/decoder 141_1 of FIG. 5, and each of the second to n-th auto-encoder/decoders 141_2 to 141_n may be learned to remove a noise of a corresponding type fault.

In an example embodiment, an auto-encoder/decoder is described with reference to FIGS. 3 to 5. An auto-encoder/decoder may be replaced with a feature learning model, e.g., a convolution autoencoder (CAE), a variational autoencoder (VAE), or a generative adversarial network (GAN).

Figure 6:
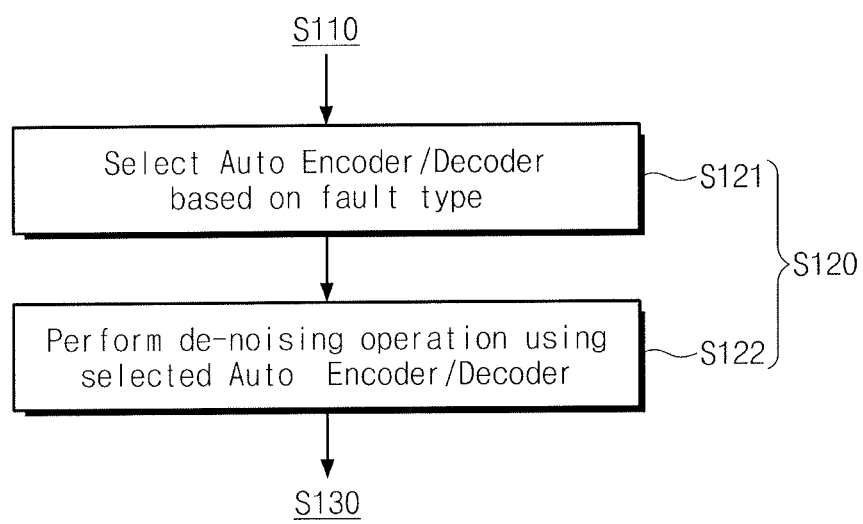
FIG. 6 illustrates a flowchart illustrating a pre-processing operation (operation S120 of FIG. 2) based on a pre-processing device of FIG. 3.

FIG. 6 illustrates a pre-processing operation (e.g., operation S120 of FIG. 2) based on a pre-processing device of FIG. 3. Referring to FIGS. 2, 3, and 6, operation S120 may include operation S121 and operation S122.

In operation S121, the pre-processing device 140-1 of the database managing device 100 may select an auto-encoder/decoder based on a fault type. For example, as described with reference to FIG. 3, the pre-processing device 140-1 may include the first to n-th auto-encoders/decoders 141_1 to 141_n. The first to n-th auto-encoders/decoders 141_1 to 141_*n* may correspond to different fault types, respectively. The pre-processing device 140-1 may select an auto-encoder/decoder based on a fault type of the reference map RM.

In operation S122, the pre-processing device 140-1 of the database managing device 100 may perform the de-noising operation by using the selected auto-encoder/decoder. For example, when the reference map RM is classified as the first fault type, the first auto-encoder/decoder 141_1 corresponding to the first fault type may be selected, and the pre-processing device 140-1 may perform the de-noising operation on a reference map with the first auto-encoder/decoder 141_1. After that, the database managing device 100 may perform operation S130.

Figure 7:
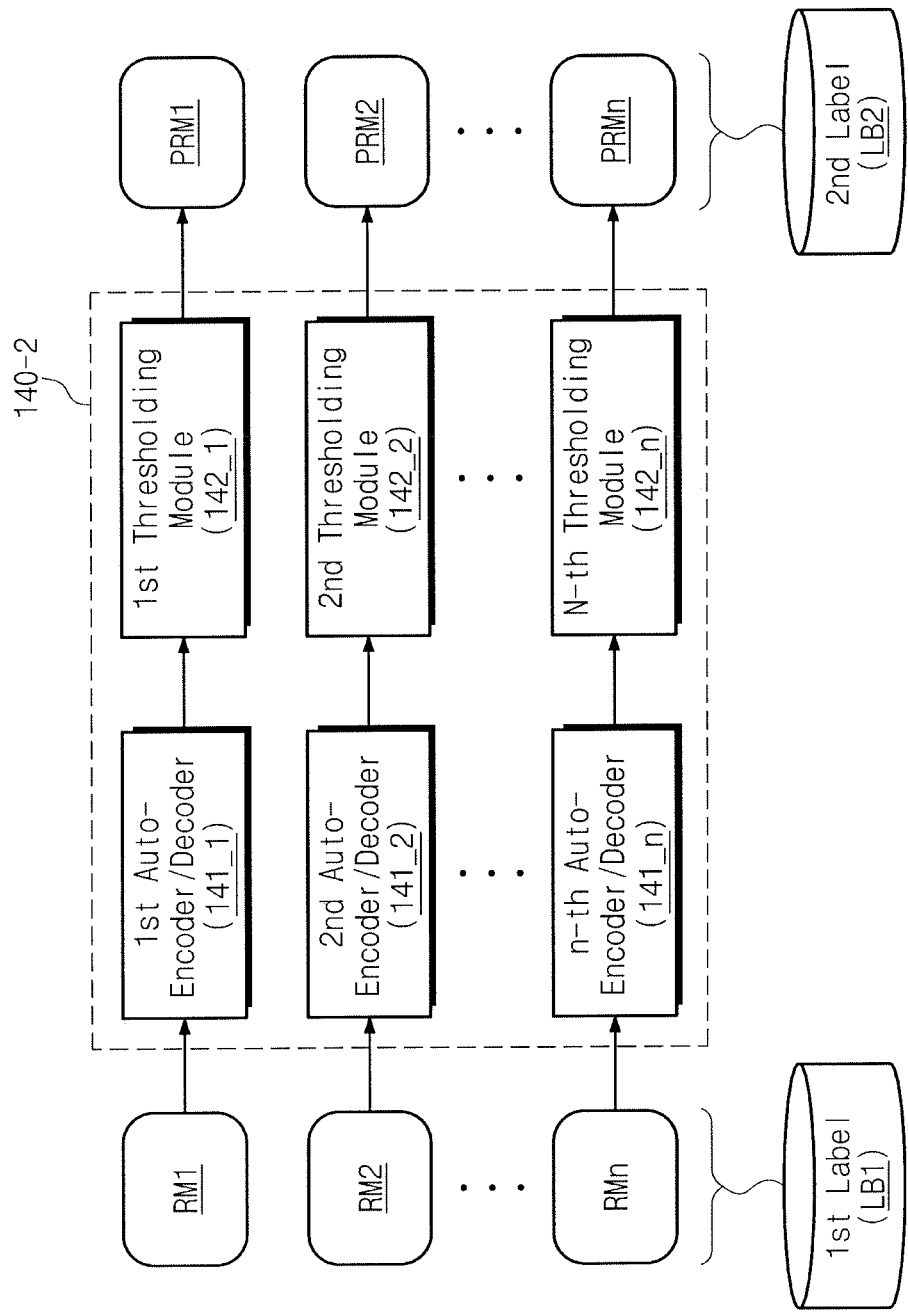
FIG. 7 illustrates a pre-processing device of FIG. 3.
Figure 8A:
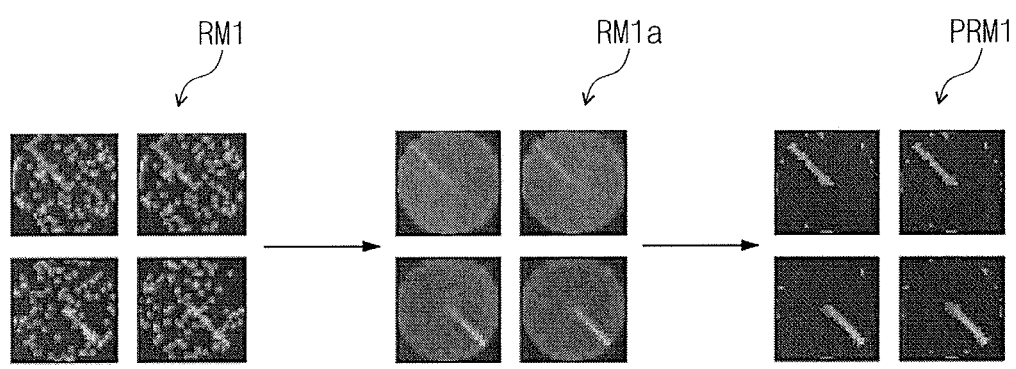
FIGS. 8A and 8B illustrate examples for describing an operation of a pre-processing device of FIG. 7.
Figure 8B:
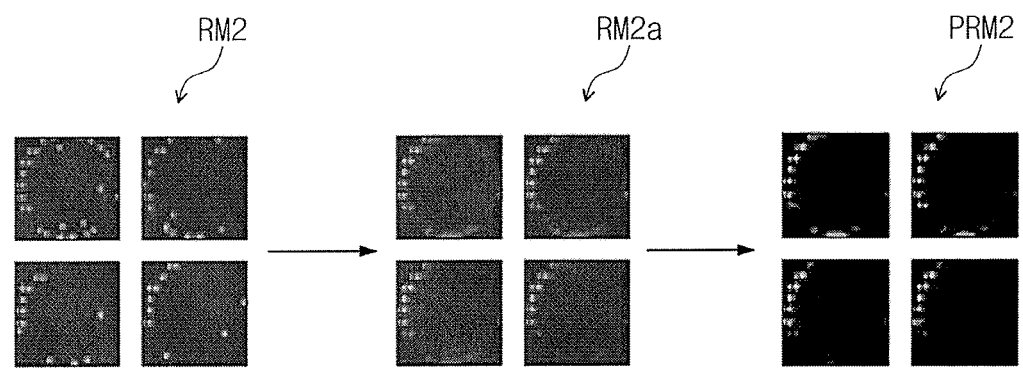

FIG. 7 illustrates a pre-processing device of FIG. 3. FIGS. 8A and 8B illustrate examples for describing an operation of a pre-processing device of FIG. 7. Referring to FIGS. 3, 7, 8A, and 8B, a pre-processing device 140-2 may include the first to n-th auto-encoders/decoders 141_1 to 141_*n* and first to n-th thresholding modules 142_1 to 142_*n*. The first to n-th auto-encoders/decoders 141_1 to 141_*n* are described with reference to FIGS. 3 to 6, and thus, additional description will be omitted.

The first to n-th thresholding modules 142_1 to 142_*n* may perform a thresholding operation on outputs of the first to n-th auto-encoders/decoders 141_1 to 141_*n*, respectively. For example, the first thresholding module 142_1 may perform the thresholding operation on an output of the first auto-encoder/decoder 141_1. The output of the first auto-encoder/decoder 141_1 may be generated by removing the noise of the first type fault from the first reference map RM1. The second thresholding module 142_2 may perform the thresholding operation on an output of the second auto-encoder/decoder 141_2. The output of the second auto-encoder/decoder 141_2 may be generated by removing the noise of the second fault type from the second reference map RM2. As in the above description, the n-th thresholding module 142_*n* may perform the thresholding operation on an output of the n-th auto-encoder/decoder 141_*n*. The output of the n-th auto-encoder/decoder 141_*n* may be generated by removing the noise of the n-th fault type from the n-th reference map RMn. In an example embodiment, the thresholding operation may include an operation of outputting a predetermined value or removing an input value when the input value is not greater than a threshold value.

In an exemplary embodiment, as illustrated in FIG. 8A, the first reference maps RM1 may include a linear fault. The first reference maps RM1 may be provided to the first auto-encoder/decoder 141_1. The first auto-encoder/decoder 141_1 may perform the de-noising operation on the first reference maps RM1 and may generate de-noised first reference maps D_RM1. The de-noised first reference maps D_RM1 may be provided to the first thresholding module 142_1. The first thresholding module 142_1 may perform the thresholding operation to output first pre-processed reference maps PRM1.

As illustrated in FIG. 8B, the second reference maps RM2 may include a random fault. The second reference maps RM2 may be provided to the second auto-encoder/decoder 141_2. The second auto-encoder/decoder 141_2 may perform the de-noising operation on the second reference maps RM2 and may generate de-noised second reference maps D_RM2. The de-noised second reference maps D_RM2 may be provided to the second thresholding module 142_2. The second thresholding module 142_2 may perform the thresholding operation to output second pre-processed reference maps PRM2.

As described with reference to FIGS. 8A and 8B, outputs of the first and second auto-encoders/decoders 141_1 and 141_2 may include information of corresponding fault types, may not include noises of the corresponding fault types, and may include other noises. For example, the first and second thresholding modules 142_1 and 142_2 may perform the thresholding operation such that the information of the corresponding fault types in the outputs of the first and second auto-encoders/decoders 141_1 and 141_2 may be clearly expressed in the first and second pre-processed maps PRM1 and PRM2.

For example, the first and second thresholding modules 142_1 and 142_2 may perform the thresholding operation on the de-noised first and second reference maps D_RM1 and D_RM2 to generate the first and second pre-processed maps PRM1 and PRM2. The thresholding operation of the first and second thresholding modules 142_1 and 142_2 may include removing information having a value, which is smaller than a threshold value, from de-noised first and second reference maps D_RM1 and D_RM2 such that only information associated with fault types (e.g., the linear fault and the random fault) of the first and second reference maps RM1 and RM2 may remain in the first and second pre-processed maps PRM1 and PRM2. Thus, as observed from the first and second pre-processed maps PRM1 and PRM2 illustrated in FIGS. 8A and 8B, information of corresponding fault types may be clearly expressed in the first and second pre-processed maps PRM1 and PRM2.

As described above, the database managing device 100 according to an exemplary embodiment may generate pre-processed reference maps by using different auto-encoders/decoders to perform the de-noising operation based on fault types of reference maps such that noises of different fault types included in reference maps may be effectively removed. Because the pre-processed reference maps include only information of corresponding fault types, accuracy and reliability of a fault analysis on a semiconductor wafer may be improved.

Figure 9:
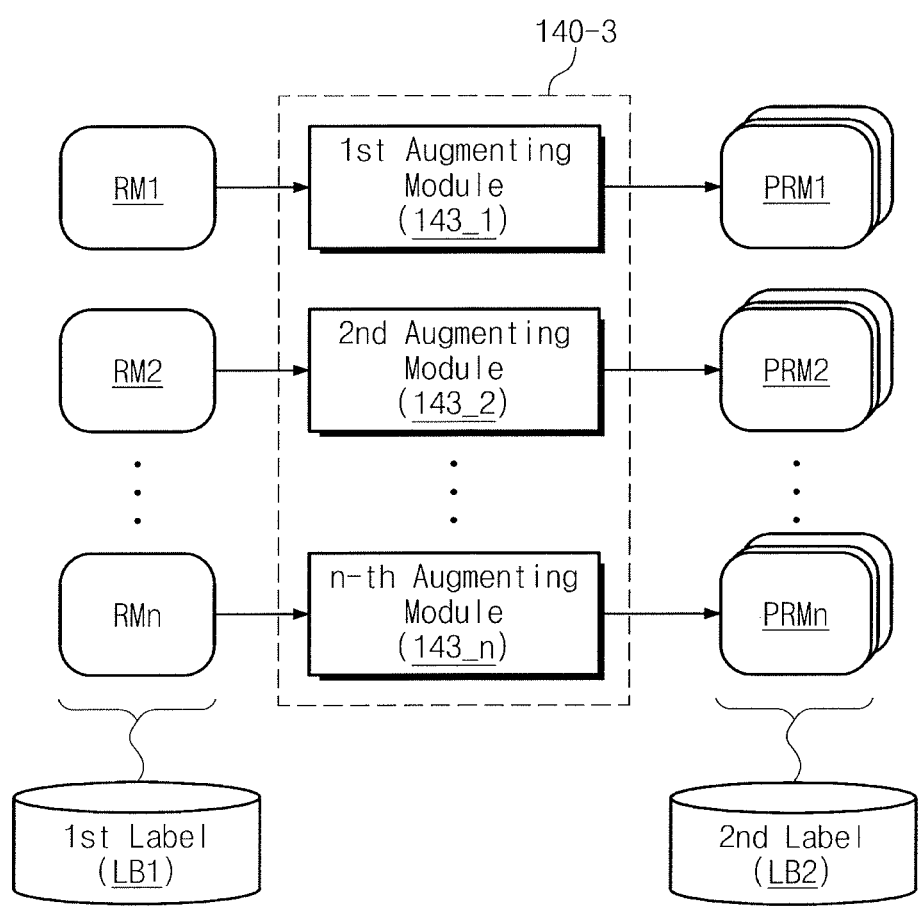
FIG. 9 illustrates a pre-processing device of FIG. 3.
Figure 10A:
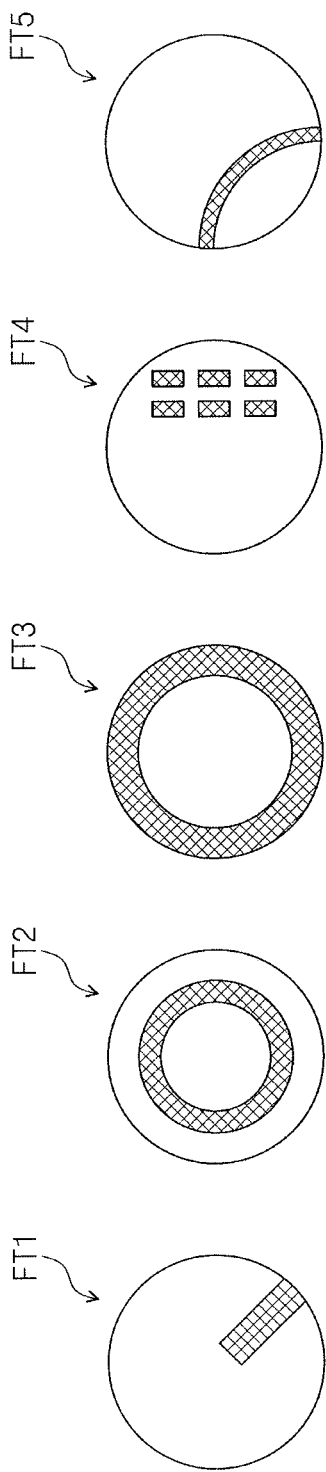
FIGS. 10A and 10B illustrate examples for describing an operation of a first augmenting module of FIG. 9.
Figure 10B:
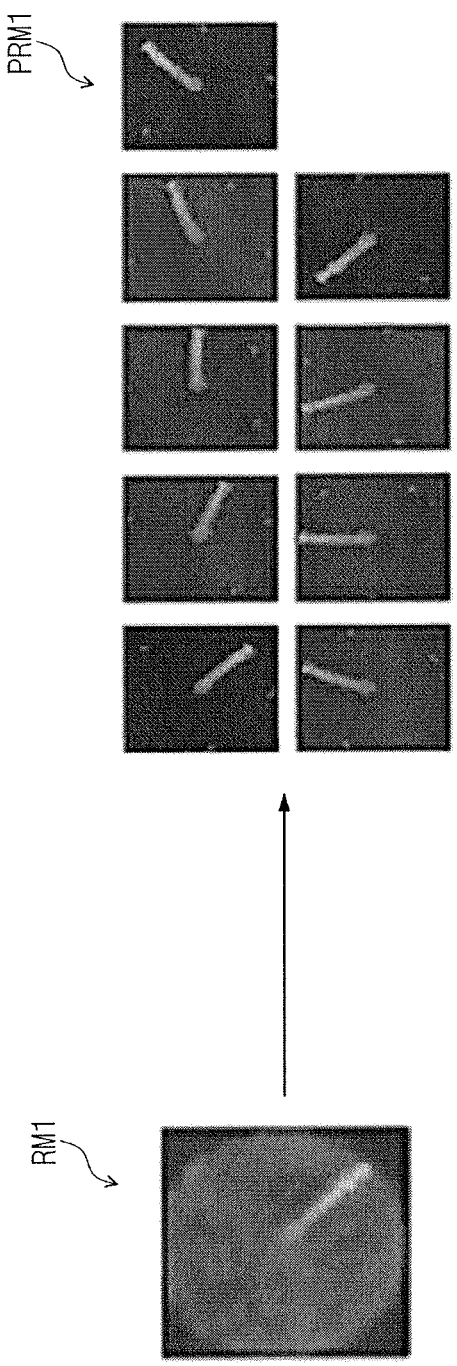

FIG. 9 illustrates a pre-processing device of FIG. 3. FIGS. 10A and 10B illustrate an operation of a first augmenting module of FIG. 9. Referring to FIG. 9, a pre-processing device 140-3 may include first to n-th augmenting modules 143_1 to 143_*n*. The first to n-th augmenting modules 143_1 to 143_*n* may augment or expand the first to n-th reference maps RM1 to RMn, respectively. In an example embodiment, the augment or expansion of the first to n-th reference maps RM1 to RMn may include generating a plurality of different reference maps based on one reference map. For example, the plurality of different reference maps may correspond to the same fault type.

For example, the first augmenting module 143_1 may generate a plurality of first pre-processed maps PRM1 by setting specific parameters based on fault types of the first reference maps RM1 and by augmenting or expanding the first reference maps RM1 based on the specific parameters. For example, as illustrated in FIG. 10A, various fault types may occur in a semiconductor wafer. For example, in FIG. 10A, a first fault type FT1 may indicate a linear fault, a second fault type FT2 may indicate a donut fault, a third fault type FT3 may indicate a ring fault, a fourth fault type FT4 may indicate a repetitive fault, and a fifth fault type FT5 may indicate a macro fault. In an example embodiment, five fault types are illustrated in FIG. 10A, but other fault types may be included. For example, the number of fault types occurring in the semiconductor wafer may be more than the number of fault types illustrated in FIG. 10A.

The first to fifth fault types FT1 to FT5 may have different patterns, respectively. For example, Table 1 below shows patterns with which the first to fifth fault types FT1 to FT5 occur.

TABLE 1

| Fault types | Names | Characteristics | Parameters |
| --- | --- | --- | --- |
| First fault type (FT1) | Linear fault | Change in rotation angle | Angle |
| Second fault type (FT2) | Donut fault | Change in occurrence area | Size and ratio |
| Third fault type (FT3) | Ring fault | Change in occurrence area | Size and ratio |
| Fourth fault type (FT4) | Repetitive fault | Repetition of identical location | Order |
| Fifth fault type (FT5) | Macro fault | Change in occurrence location | Distance |

As shown in Table 1, the linear fault of the first fault type FT1 may occur in the form of rotating on the semiconductor wafer. For example, when any one of the first reference maps RM1 associated with the first fault type FT1 is rotated at an angle of a specific unit, the rotated map and the first reference maps RM1 may be matched or may be similar with each other. For example, when the first reference maps RM1 have the linear fault, the first reference maps RM1 may be matched or may be similar with each other by rotating the first reference maps RM1 by corresponding angles. Thus, a plurality of first pre-processed reference maps PRM1 may be generated by rotating each of the first reference maps RM1 at an angle of a specific unit (i.e., a parameter). For example, as illustrated in FIG. 10B, the plurality of first pre-processed reference maps PRM1 may be generated by rotating the first reference map RM1 including the linear fault of the first fault type FT1 by approximately 22.5 degrees.

For example, a first one of the plurality of first pre-processed reference maps PRM1 may not be rotated. A second one of the plurality of first-processed reference maps may be generated by rotating by about 22.5 degree. A third one of the first pre-processed reference maps PRM1 may be generated by rotating by about 45 degree. A fourth one of the first pre-processed reference maps PRM1 may be generated by rotating by about 67.5 degree. A fifth one of the first pre-processed reference maps PRM1 may be generated by rotating by about 90 degree. A sixth one of the first pre-processed reference maps PRM1 may be generated by rotating by about 112.5 degree. A seventh one of the first pre-processed reference maps PRM1 may be generated by rotating by about 135 degree. An eighth one of the first pre-processed reference maps PRM1 may be generated by rotating by about 157.5 degree. A ninth one of the first pre-processed reference maps PRM1 may be generated by rotating by about 180 degree. For example, each of the first pre-processed reference maps PRM1 may be similar or matched with at least one of different reference maps classified as the first fault type FT1. The plurality of first pre-processed reference maps PRM1 thus generated may be stored in the second label LB2, and may be used in a following semiconductor wafer fault analysis operation.

Even though fault types of reference maps are identical, information or shapes of the reference maps may vary according to a characteristic of a fault type. For example, when the reference maps do not have sufficient number, accuracy and reliability of a semiconductor wafer fault analysis operation may decrease.

According to an exemplary embodiment, in order to increase the number of the reference maps, various shapes of the reference maps of the same fault type may be generated by augmenting or expanding the reference maps according to a corresponding parameter of the same fault type. For example, as the limited number of reference maps are augmented or expanded based on a fault type of reference maps, accuracy and reliability of a following semiconductor wafer fault analysis may be improved.

Figure 11:
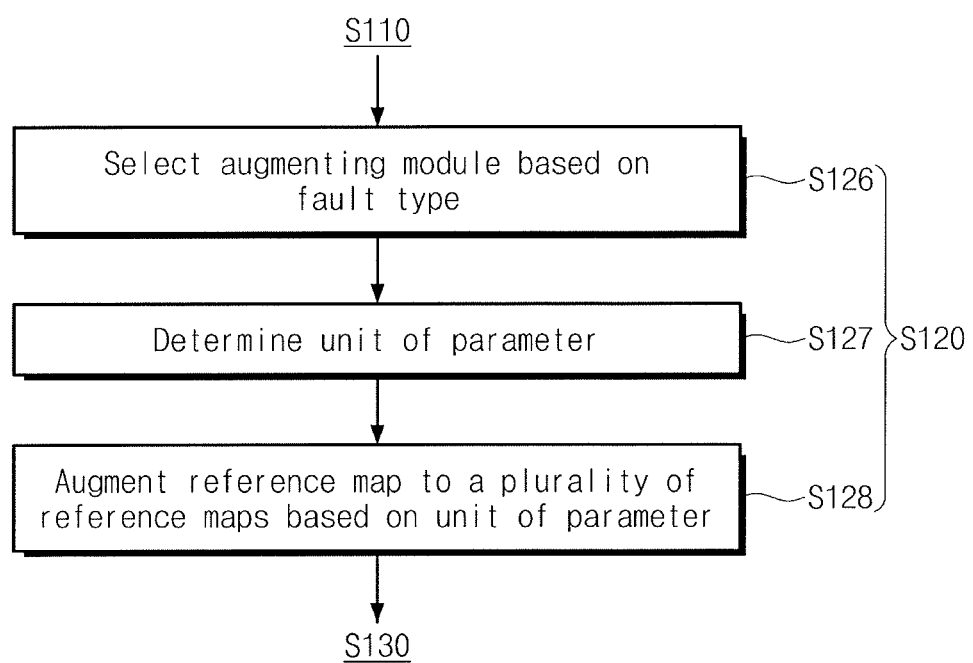
FIG. 11 illustrates an operation of a database managing device according to an operation of a pre-processing device of FIG. 9.

FIG. 11 illustrates an operation of a database managing device according to an operation of a pre-processing device of FIG. 9. Referring to FIGS. 1, 2, 9, and 11, operation S120 may include operation S126, operation S127, and operation S128.

In operation S126, the pre-processing device 140-3 of the database managing device 100 may select an augmenting module based on a fault type. For example, as described with reference to FIG. 9, the pre-processing device 140-3 may include the first to n-th augmenting modules 143_1 to 143_n. The first to n-th augmenting modules 143_1 to 143_n may be configured to expand reference maps of different fault types, respectively. In other words, the first to n-th augmenting modules 143_1 to 143_n may be configured to expand reference maps based on different parameters corresponding to the different fault types. The pre-processing device 140-3 may select an augmenting module based on a fault type of a reference map.

In operation S127, the pre-processing device 140-3 may determine a unit of a parameter. In other words, the pre-processing device 140-3 may determine a minimum unit of a parameter, which is used to expand a reference map. For example, as described with reference to FIG. 10B, when the fault type is associated with the linear fault, the pre-processing device 140-3 may determine the minimum unit of the parameter based on a difference between the expanded reference maps and existing maps.

In operation S128, the pre-processing device 140-3 may generate a plurality of reference maps by augmenting or expanding a reference map based on the determined minimum unit of the parameter. In an example embodiment, a plurality of reference maps may be pre-processed reference maps, and the plurality of reference maps may be information or data expanded from one reference map. In operation S130, the database managing device 100 may update a database based on the plurality of reference maps.

Figure 12:
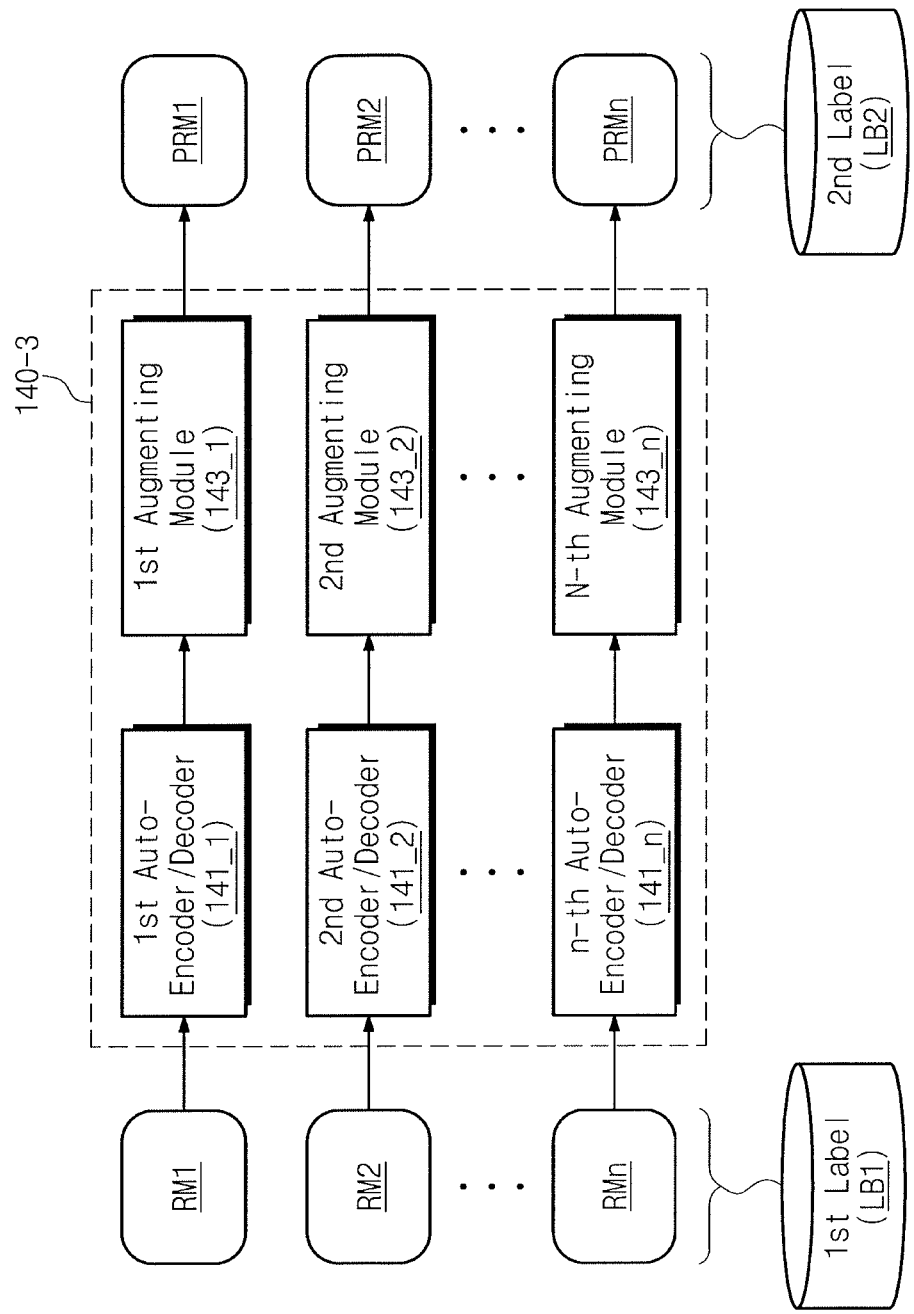
FIG. 12 illustrates a pre-processing device of FIG. 2.

FIG. 12 illustrates a pre-processing device of FIG. 2. Referring to FIGS. 2 and 12, a pre-processing device 140-4 may include the first to n-th auto-encoders/decoders 141_1 to 141_n and the first to n-th augmenting modules 143_1 to 143_n. The first to n-th auto-encoders/decoders 141_1 to 141_n and the first to n-th augmenting modules 143_1 to 143_n are described above, and thus, additional description will be omitted.

As in the above description, the first to n-th auto-encoders/decoders 141_1 to 141_n may perform the de-noising operation on the first to n-th reference maps RM1 to RMn based on fault types of the first to n-th reference maps RM1 to RMn stored in the first label LB1. The first to n-th augmenting modules 143_1 to 143_n may generate a plurality of first to n-th pre-processed reference maps PRM1 to PRMn by augmenting or expanding outputs of the first to n-th auto-encoders/decoders 141_1 to 141_n based on the corresponding fault types. The plurality of first to n-th pre-processed reference maps PRM1 to PRMn may be stored in the second label LB2.

For example, the first to n-th pre-processed reference maps PRM1 to PRMn, which are generated by the pre-processing device 140-4 of FIG. 12, may be generated by removing noises of fault types from the reference maps RM1 to RMn and augmenting or expanding de-noised reference maps to a plurality of reference maps based on parameters associated with the corresponding fault types.

As described above, the database managing device 100 according to an exemplary embodiment may improve accuracy and reliability of reference maps by performing the pre-processing operation on reference maps. For example, the pre-processing operation may include the de-noising operation based on a fault type of each reference map. The de-noising operation may be performed by different auto-encoders/decoders based on a fault type. Further, the pre-processing operation may include an operation of augmenting or expanding a reference map based on each fault type, or a combination thereof. For example, accuracy and reliability of pre-processed reference maps may be improved by performing a different de-noising operation or a different reference map augmenting (or expanding) operation based on a fault type of a reference map. In an example embodiment, as the accuracy and reliability of the reference maps or the pre-processed reference maps may be increased, accuracy and reliability of a semiconductor wafer fault analysis using the reference maps or the pre-processed reference maps may be increased.

Figure 13:
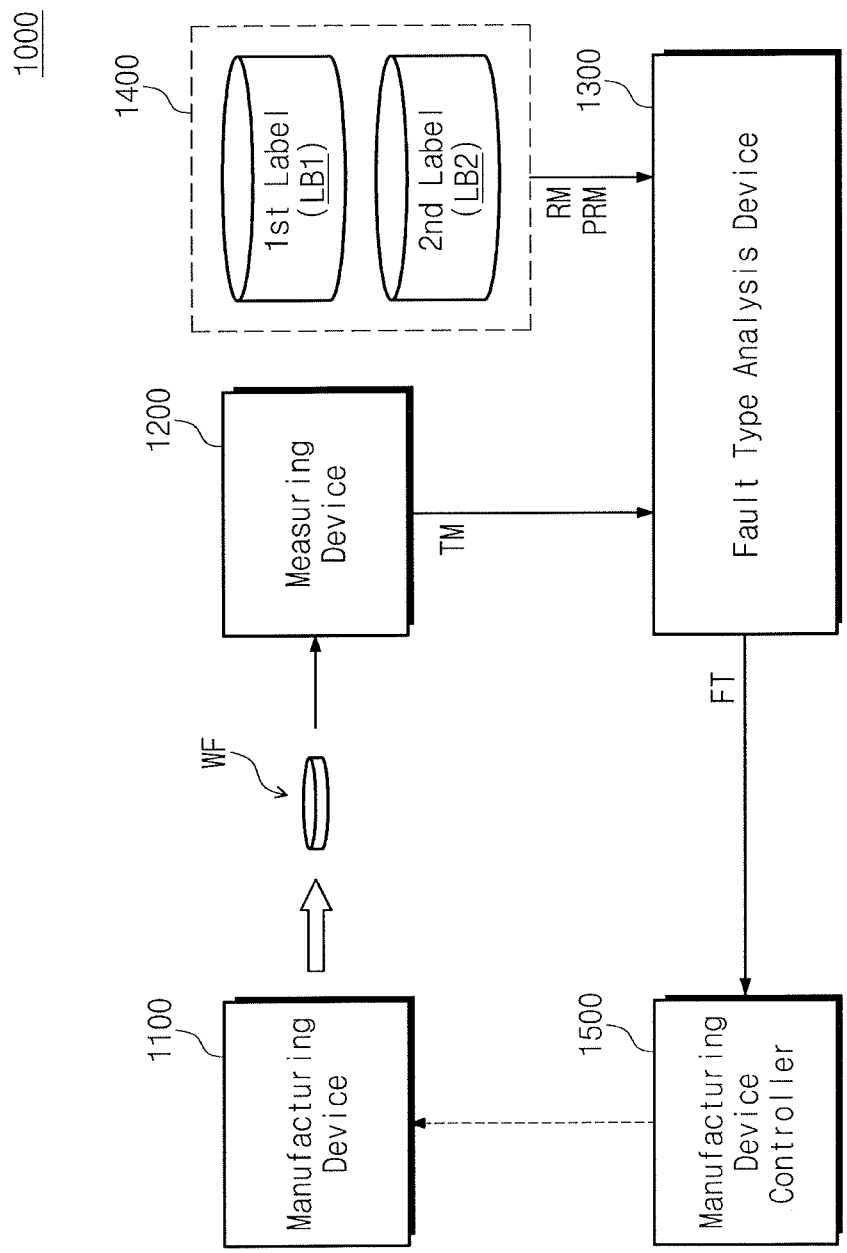
FIG. 13 illustrates a block diagram illustrating a semiconductor wafer fault analysis system according to an exemplary embodiment.

FIG. 13 illustrates a semiconductor wafer fault analysis system according to an exemplary embodiment. Referring to FIG. 13, a semiconductor wafer fault analysis system 1000 may include a manufacturing device 1100, a measuring device 1200, a fault type analysis device 1300, a database 1400, and a manufacturing device controller 1500.

The manufacturing device 1100 may manufacture the semiconductor wafer WF through various processes. For example, the manufacturing device 1100 may manufacture the semiconductor wafer WF having various semiconductor patterns by performing various processes on the semiconductor wafer WF, e.g., an etching process, a deposition process, and a planarization process.

The measuring device 1200 may perform various test operations on the semiconductor wafer WF, which is manufactured by the manufacturing device 1100, and may generate a map (hereinafter referred to as a "target map TM") of the semiconductor wafer WF. Information of the generated target map TM may be provided to the fault type analysis device 1300.

The fault type analysis device 1300 may determine whether the target map TM is defective. In an example embodiment, when the target map TM is defective, the semiconductor wafer WF corresponding to the target map TM may be defective.

When the target map TM is defective, the fault type analysis device 1300 may classify a fault type of the target map TM based on a plurality of reference maps RM stored in a first label LB1 of the database 1400 or a plurality of pre-processed reference maps PRM stored in a second label LB2 of the database 1400.

For example, the fault type analysis device 1300 may compare the target map TM with the plurality of reference maps RM or the plurality of pre-processed reference maps PRM by each pixel or by each bit. The fault type analysis device 1300 may select a reference map or a pre-processed reference map, which is matched with or is identical to the target map TM, based on a result of the comparison. The fault type analysis device 1300 may determine a fault type of the target map TM as a fault type corresponding to the selected reference map or the selected pre-processed reference map.

In an example embodiment, the pre-processed reference maps PRM included in the second label LB2 of the database 1400 may be data generated by at least one of the pre-processing devices 140, 140-1, 140-2, 140-3, and 140-4 described with reference to FIGS. 1 to 12. For example, as the fault type analysis device 1300 uses the pre-processed reference maps PRM described with reference to FIGS. 1 to 12 to perform a fault analysis operation on the target map TM, accuracy and reliability of the fault analysis operation may be improved.

The fault type analysis device 1300 may provide the manufacturing device controller 1500 with information of a fault type FT corresponding to the target map TM.

The manufacturing device controller 1500 may control the manufacturing device 1100 based on the information on fault type FT provided from the fault type analysis device 1300. For example, the manufacturing device controller 1500 may remove a failure cause corresponding to the information of the fault type FT by controlling the manufacturing device 1100 based on the information of the fault type FT provided from the fault type analysis device 1300.

As described above, a semiconductor wafer fault analysis system according to an exemplary embodiment may use the reference maps RM and the pre-processed reference maps PRM to perform a fault analysis operation on the target map TM. For example, when the reference maps RM do not have sufficient number or when reliability of the reference maps RM is not satisfied, the pre-processed reference maps PRM may be further generated through the pre-processing operation associated with the reference maps RM. Thus, accuracy and reliability of the semiconductor wafer fault analysis operation may be improved.

Figure 14:
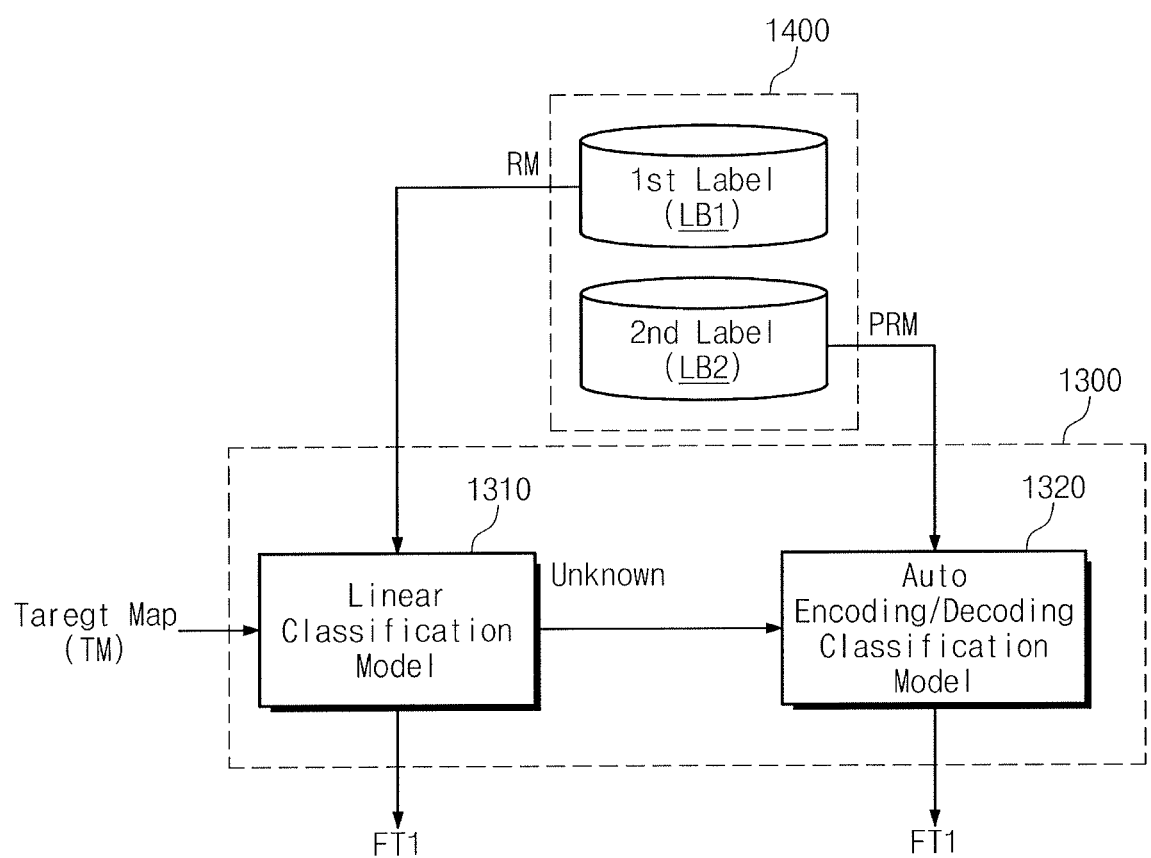
FIG. 14 illustrates a fault type analysis device of FIG. 13.
Figure 15:
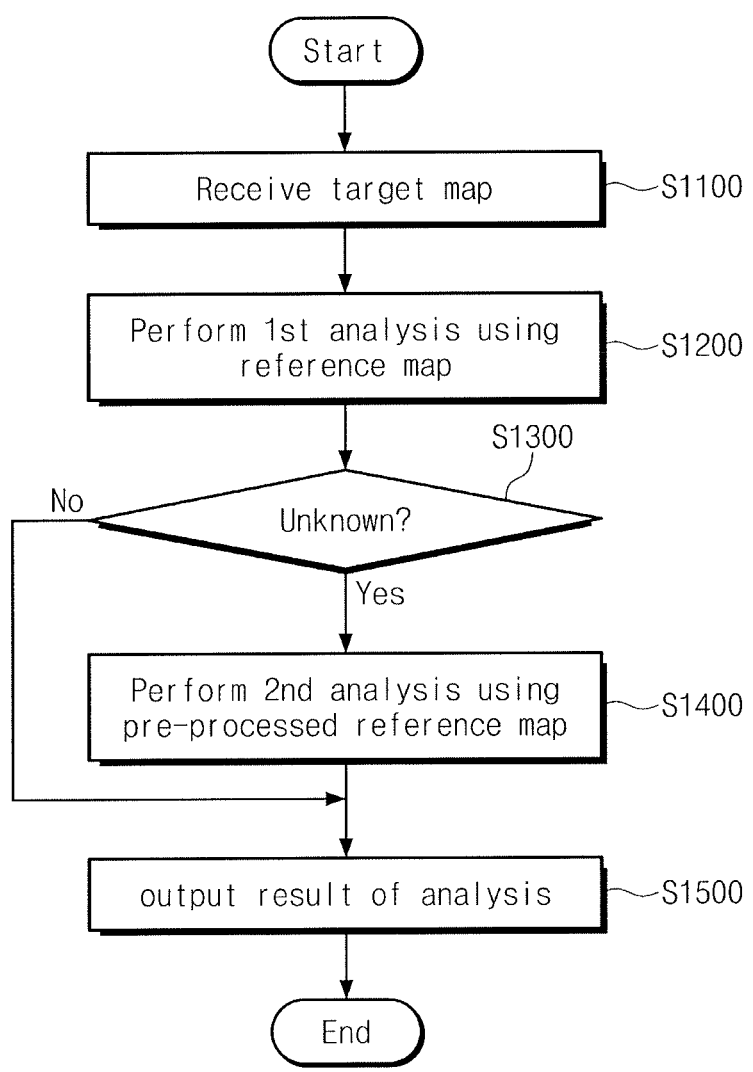
FIG. 15 illustrates an operation of a fault type analysis device of FIG. 14.

FIG. 14 illustrates a fault type analysis device of FIG. 13. FIG. 15 illustrates an operation of a fault type analysis device of FIG. 14. Referring to FIGS. 13 to 15, the fault type analysis device 1300 may include a linear classification model 1310 and an auto-encoding/decoding classification model 1320. The fault type analysis device 1300 may perform a fault type analysis on the target map TM, which is obtained by measuring the semiconductor wafer WF by the measuring device 1200, in a sequential manner.

For example, in operation S1100 of FIG. 15, the fault type analysis device 1300 may receive the target map TM from the measuring device 1200.

In operation S1200, the fault type analysis device 1300 may use the reference maps RM to perform a first analysis on the target map TM. For example, as illustrated in FIG. 14, the linear classification model 1310 of the fault type analysis device 1300 may receive the target map TM and may determine a fault type of the received target map TM through an operation of comparing the received target map TM with reference maps RM of the first label LB1 of the database 1400 (e.g., a pixel-based comparison operation). For example, the first analysis, which is associated with the target map TM, may be performed by using the reference maps RM that are not pre-processed.

In operation S1300, the fault type analysis device 1300 may determine whether a result of the first analysis on the target map TM, which is performed by the linear classification model 1310, is unknown. For example, the fault type analysis device 1300 may determine whether the fault type of the target map TM is classified through the first analysis or not classified.

When the fault type of the target map TM is not classified through the first analysis in operation S1300, the fault type analysis device 1300 may use the pre-processed reference maps PRM to perform a second analysis in operation S1400.

For example, as illustrated in FIG. 14, when a fault type of the target map TM is not classified by the linear classification model 1310 of the fault type analysis device 1300 (i.e., unknown), the second analysis may be performed by the auto-encoding/decoding classification model 1320 of the fault type analysis device 1300.

The auto-encoding/decoding classification model 1320 may use the pre-processed reference maps PRM stored in the second label LB2 of the database 1400 to determine the fault type of the target map TM. For example, the auto-encoding/decoding classification model 1320 may determine the fault type of the target map TM through an operation of comparing the target map TM with the pre-processed reference maps PRM stored in the second label LB2 of the database 1400. For example, the operation of comparing the target map TM with the pre-processed reference maps PRM may be a pixel-based comparison operation. For example, the second analysis on the target map TM may be performed by using the pre-processed reference map PRM that does not include a noise of a corresponding fault type or that is augmented or expanded. For example, in operation S1500, the fault type analysis device 1300 may output an analysis result as information of a fault type FT.

In an example embodiment, the second analysis, which is performed by the auto-encoding/decoding classification model 1320, may have reliability higher than the first analysis, which is performed by the linear classification model 1310. As described above, the pre-processed reference maps PRM may not include information of a noise of a corresponding fault type or may include information, which is augmented or expanded based on a parameter of the corresponding fault type. For example, as the pre-processed reference maps PRM include only information about the corresponding fault type, reliability of an analysis operation may be improved.

Figure 16:
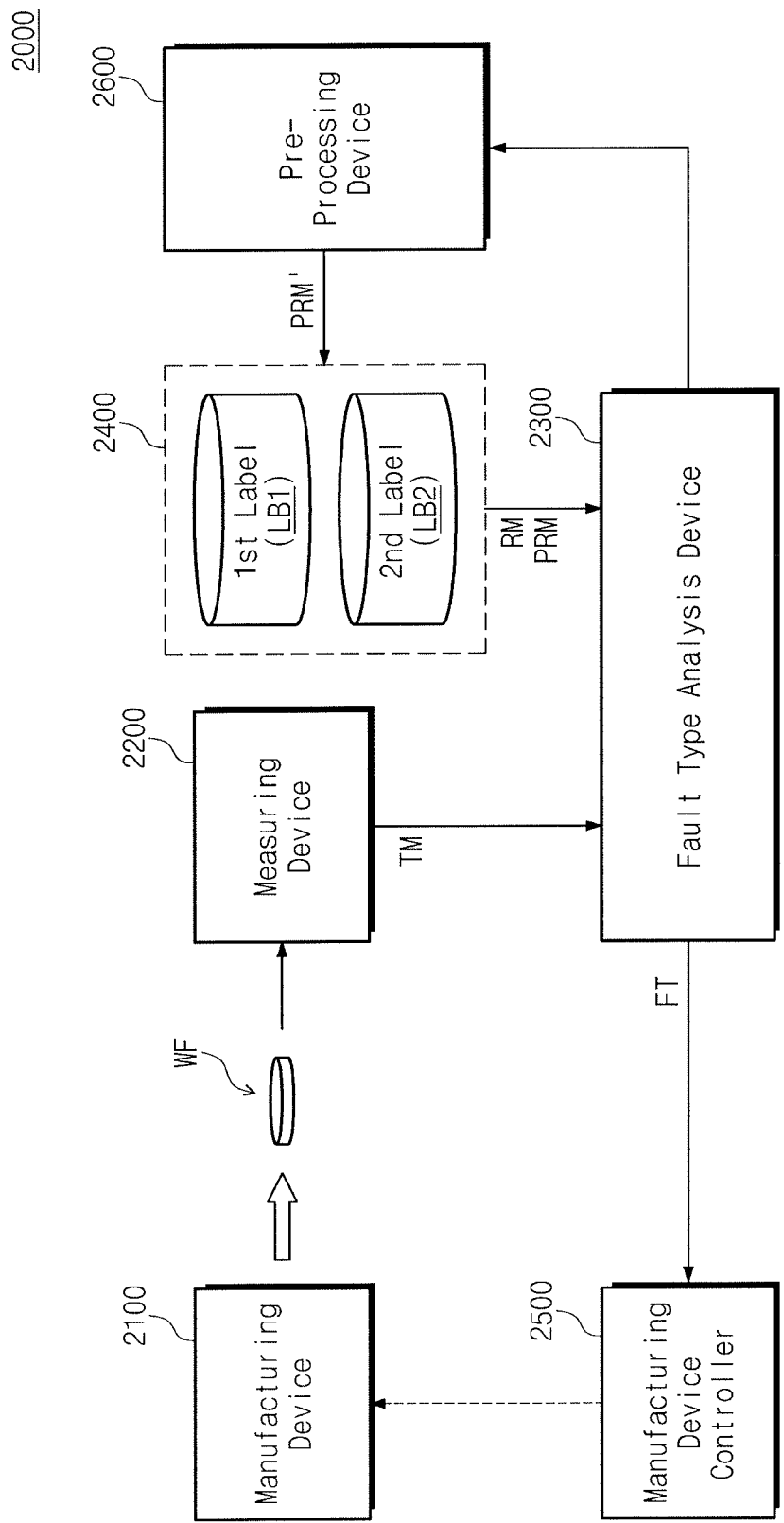
FIG. 16 illustrates a semiconductor wafer fault analysis system according to an exemplary embodiment.

FIG. 16 illustrates a semiconductor wafer fault analysis system according to an exemplary embodiment. Referring to FIG. 16, a semiconductor wafer fault analysis system 2000 may include a manufacturing device 2100, a measuring device 2200, a fault type analysis device 2300, a database 2400, a manufacturing device controller 2500, and a pre-processing device 2600. The manufacturing device 2100, the measuring device 2200, the fault type analysis device 2300, the database 2400, and the manufacturing device controller 2500 are described with reference to FIGS. 13 to 15, and thus, additional description will be omitted.

The semiconductor wafer fault analysis system 2000 of FIG. 16 may further include the pre-processing device 2600 compared with the semiconductor wafer fault analysis system 1000 of FIG. 13. The pre-processing device 2600 may be at least one of the pre-processing devices 140, 140-1, 140-2, 140-3, and 140-4 described with reference to FIGS. 1 to 12.

For example, the pre-processing device 2600 may update the database 2400 by performing a pre-processing operation on the target map TM based on the information of fault type FT of the target map TM. The information of the first type FT may be classified by the fault type analysis device 2300 and storing pre-processed information PRM' in the second label LB2 of the database 2400.

In an example embodiment, as the above fault analysis operation and the above update operation of the database 2400 are repeatedly performed, accuracy and reliability of the first label LB1 and the second label LB2 of the database 2400 may be improved.

Figure 17:
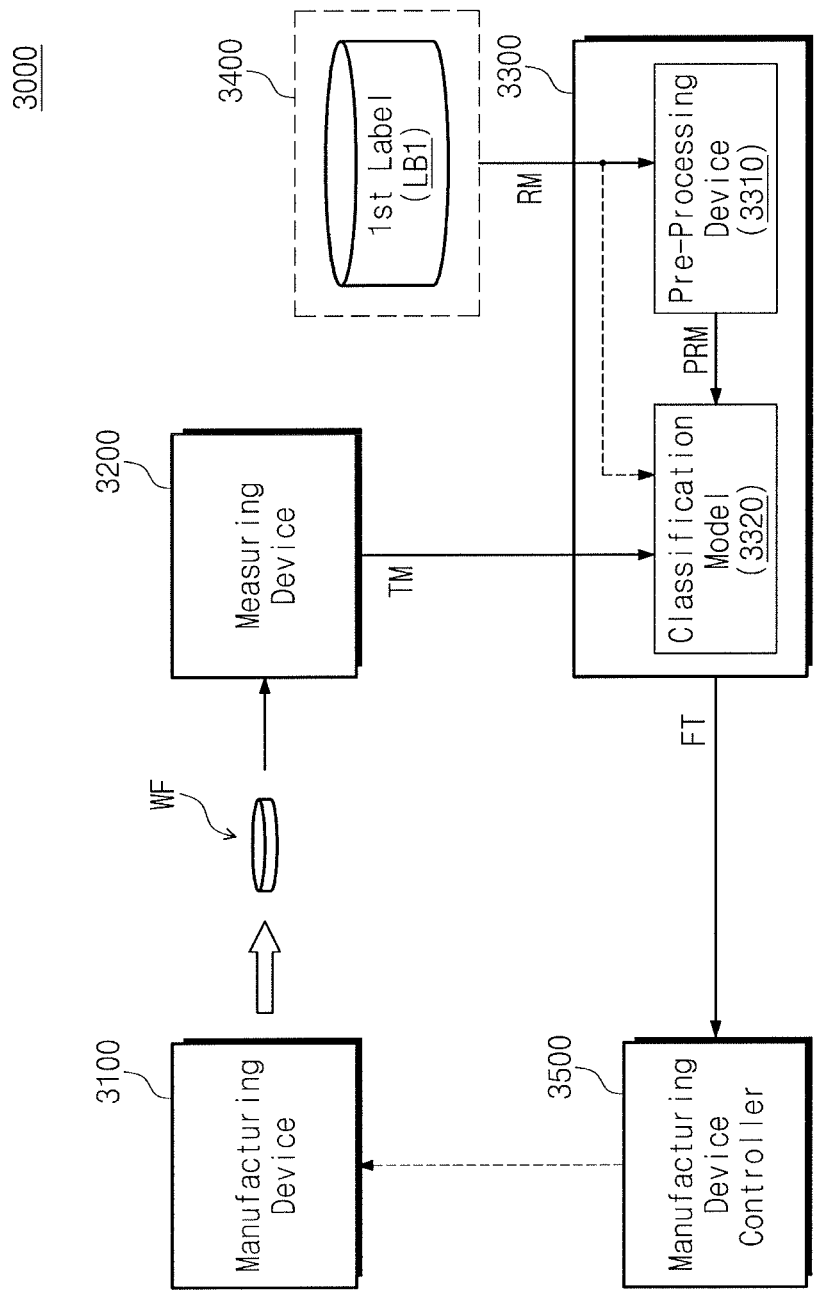
FIG. 17 illustrates a semiconductor wafer fault analysis system according to an exemplary embodiment.

FIG. 17 illustrates a semiconductor wafer fault analysis system according to an exemplary embodiment. Referring to FIG. 17, a semiconductor wafer fault analysis system 3000 may include a manufacturing device 3100, a measuring device 3200, a fault type analysis device 3300, a database 3400, and a manufacturing device controller 3500. The manufacturing device 3100, the measuring device 3200, and the manufacturing device controller 3500 are described above, and thus, additional description will be omitted.

The fault type analysis device 3300 may include a pre-processing device 3310 and a classification model 3320. In an example embodiment, the pre-processing device 3310 may be at least one of the pre-processing devices 140, 140-1, 140-2, 140-3, and 140-4 described with reference to FIGS. 1 to 12. For example, the pre-processing device 3310 may generate pre-processed reference maps PRM by performing a pre-processing operation. For example, the pre-processing operation may be a de-noising operation or a map augmenting or expanding operation described with reference to FIGS. 1 to 12 of a different manner based on a fault type of each of the reference maps RM in the first label LB1 of the database 3400.

The classification model 3320 may perform an analysis on the target map TM by using the pre-processed reference maps PRM from the pre-processing device 3310. In an example embodiment, the classification model 3320 may perform an analysis on the target map TM as in the auto-encoding/decoding classification model 1320 described with reference to FIG. 14. For example, the classification model 3320 may perform an analysis on the target map TM by using the reference maps RM as in the linear classification model 1310 of FIG. 14.

In an example embodiment, the classification model 3320 may perform an analysis on the target map TM based on an auto-encoding classification model. For example, the auto-encoding classification model may classify a fault type of the target map TM by comparing compressed information generated by the auto-encoder AE described with reference to FIG. 5 with the target map TM. For example, the compressed information may be information of the second hidden layer HL2 of FIG. 5.

In an example embodiment, the target map TM classified as a specific fault type may be additionally stored in the first label LB1 of the database 3400 together with information of the specific fault type.

According to exemplary embodiments described above, as a different pre-processing operation is performed according to a fault type of each reference map, accuracy and reliability of a database for a semiconductor wafer fault analysis operation may be improved. For example, when reference maps included in a database is not sufficient for a semiconductor wafer fault analysis or when accuracy of reference maps is low, accuracy and reliability of the database may be improved through the pre-processing operation according to exemplary embodiments.

According to exemplary embodiments, as a semiconductor wafer fault analysis system performs a pre-processing operation on reference maps, accuracy and reliability of reference data (e.g., a reference map) for a semiconductor wafer fault analysis may be improved. Thus, the semiconductor fault analysis system with improved accuracy and reliability and an operation method thereof are provided.

While exemplary embodiments have been described, it will be apparent to those of ordinary skill in the art that various changes and modifications may be made thereto without departing from the spirit and scope of the inventive concept as set forth in the following claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor wafer fault analysis system comprising a computer having a processor and a storage, the computer functioning as:
   a database to store a first reference map of a wafer, which is classified as a first fault type, and a second reference map of a wafer, which is classified as a second fault type;
   a first auto-encoder/decoder to remove a noise corresponding to the first fault type from the first reference map to generate a first pre-processed reference map;
   a second auto-encoder/decoder to remove a noise corresponding to the second fault type from the second reference map to generate a second pre-processed reference map; and
   a fault type analyzer, wherein:
   the database is updated based on the first and second pre-processed reference maps, and
   the fault type analyzer is to classify a fault type of a target map based on a comparison with the updated database, the target map being generated by measuring a target wafer,
   wherein the fault type analyzer includes:
   a linear classificator to compare the target map with the first reference map and the second reference map in the updated database and to classify the fault type of the target map; and
   an auto-encoding/decoding classificator, wherein,
   when the fault type of the target map is not classified by the linear classificator, the auto-encoding/decoding classificator is to compare the target map with the first and second pre-processed reference maps in the updated database and to classify the fault type of the target map.

2. The semiconductor wafer fault analysis system as claimed in claim 1, wherein the computer further functions as:
   a first thresholder to perform a thresholding operation on the first pre-processed reference map based on information of the first fault type to generate a first thresholding reference map; and
   a second thresholder to perform a thresholding operation on the second pre-processed reference map based on information of the second fault type to generate a second thresholding reference map, and
   wherein the database is updated with the first and second thresholding reference maps that are generated based on the first and second pre-processed reference maps.

3. The semiconductor wafer fault analysis system as claimed in claim 1, wherein the computer further functions as:
   a first augmenter to augment the first pre-processed reference map based on a first parameter corresponding to the first fault type to generate a plurality of first augmented reference maps; and
   a second augmenter to augment the second pre-processed reference map based on a second parameter corresponding to the second fault type to generate a plurality of second augmented reference maps, and
   wherein the database is updated with the plurality of first and second augmented reference maps that are generated by augmenting the first and second pre-processed reference maps.

4. The semiconductor wafer fault analysis system as claimed in claim 3,
   wherein the first and second parameters have different features.

5. The semiconductor wafer fault analysis system as claimed in claim 1, wherein
   the target map is generated by measuring the target wafer.

6. The semiconductor wafer fault analysis system as claimed in claim 1,
   wherein the first auto-encoder/decoder includes:
   a first auto-encoder to receive the first reference map and to encode the first reference map; and
   a first auto-decoder to decode the encoded first reference map by the first auto-encoder and to output the decoded first reference map as the first pre-processed reference map, and
   wherein the second auto-encoder/decoder includes:
   a second auto-encoder to receive the second reference map and to encode the second reference map, and
   a second auto-decoder to decode the encoded second reference map by the second auto-encoder and to output the decoded second reference map as the second pre-processed reference map.

7. The semiconductor wafer fault analysis system as claimed in claim 6,
   wherein the first auto-encoder and the first auto-decoder are further configured to perform an un-supervised learning with first additional reference maps that are classified as the first fault type, and
   wherein the second auto-encoder and the second auto-decoder are further configured to perform an un-supervised learning with second additional reference maps that are classified as the second fault type.

8. The semiconductor wafer fault analysis system as claimed in claim 1,
   wherein, when the fault type of the target map is classified by the fault type analyzer, the target map is stored in the updated database as a third reference map corresponding to the classified fault type, and
   wherein one corresponding to the classified fault type among the first auto-encoder/decoder and the second auto-encoder/decoder is further to remove a noise of the classified fault type from the third reference map and to generate a third pre-processed reference map.

9. The semiconductor wafer fault analysis system as claimed in claim 1,
   wherein information of the classified fault type of the target map is provided to an external manufacturing device controller.

10. A semiconductor wafer fault analysis system comprising a computer having a processor and a storage, the computer functioning as:
    a database including a first reference map of a wafer that is classified as a first fault type and a second reference map of a wafer that is classified as a second fault type; and
    a fault type analyzer to classify a fault type of a target map, generated by testing a target semiconductor wafer, based on the first reference map and the second reference map in the database, wherein
the fault type analyzer includes:
a linear classificator to compare the target map with the first reference map and the second reference map in the database and to classify the fault type of the target map;
a pre-processer to perform a first pre-processing operation on the first reference map by using information of the first fault type to generate one or more first pre-processed reference maps and to perform a second pre-processing operation on the second reference map by using information about the second fault type to generate one or more second pre-processed reference maps; and
an auto-encoding/decoding classificator,
wherein:
when the fault type of the target map is not classified by the linear classificator, the auto-encoding/decoding classificator is configured to classify the fault type of the target map by comparing the target map with each of the one or more first pre-processed reference maps and the one or more second pre-processed reference maps.

11. The semiconductor wafer fault analysis system as claimed in claim 10,
wherein the pre-processer includes:
a first auto-encoder/decoder to generate the one or more first pre-processed reference maps by performing the first pre-processing operation on the first reference map such that a noise corresponding to the first fault type is removed from the first reference map; and
a second auto-encoder/decoder to generate the one or more second pre-processed reference maps by performing the second pre-processing operation on the second reference map such that a noise corresponding to the second fault type is removed from the second reference map.

12. The semiconductor wafer fault analysis system as claimed in claim 10,
wherein the pre-processer includes:
a first auto-encoder/decoder to remove a noise corresponding to the first fault type from the first reference map;
a first thresholder to perform a first thresholding operation on an output of the first auto-encoder/decoder by using information of the first fault type to output the one or more first pre-processed reference maps;
a second auto-encoder/decoder to remove a noise corresponding to the second fault type from the second reference map; and
a second thresholder to perform a second thresholding operation on an output of the second auto-encoder/decoder by using information of the second fault type to output the one or more second pre-processed reference maps.

13. The semiconductor wafer fault analysis system as claimed in claim 10,
wherein the pre-processer includes:
a first augmenter module to expand the first reference map by using a first parameter corresponding to the first fault type and to generate the one or more first pre-processed reference maps; and
a second augmenter module to expand the second reference map by using a second parameter corresponding to the second fault type and to generate the one or more second pre-processed reference maps.

14. The semiconductor wafer fault analysis system as claimed in claim 10,
wherein the database is updated based on the target map and information of the classified fault type of the target map.

15. An operation method of a semiconductor wafer fault analysis system, the method comprising:
performing a first pre-processing operation on a first reference map of a wafer, which is classified as a first fault type, based on information of the first fault type to generate one or more first pre-processed reference maps;
performing a second pre-processing operation on a second reference map of a wafer, which is classified as a second fault type, based on information of the second fault type to generate one or more second pre-processed reference maps;
generating a target map by measuring a target semiconductor wafer;
classifying a fault type of the target map based on the first reference map, the second reference map, the one or more first pre-processed reference maps, and the one or more second pre-processed reference maps; and
outputting information of the classified fault type of the target map, wherein:
the first pre-processing operation is performed by a first auto-encoder/decoder, and
the second pre-processing operation is performed by a second auto-encoder/decoder different from the first auto-encoder/decoder,
wherein the classified fault type of the target map is classified by comparing the target map with the first reference map and the second reference map, and
wherein, when the classified fault type of the target map is not classified by comparing the target map with the first reference map and the second reference map, the classified fault type of the target map is classified by comparing the target map with the one or more first pre-processed reference maps or the one or more second pre-processed reference maps.

16. The method as claimed in claim 15,
wherein the first auto-encoder/decoder is adjusted through an un-supervised learning based on first additional reference maps that are classified as the first fault type,
wherein the first pre-processing operation includes removing a noise of the first fault type from the first reference map by the first auto-encoder/decoder,
wherein the second auto-encoder/decoder is adjusted through an un-supervised learning based on second additional reference maps that are classified as the second fault type, and
wherein the second pre-processing operation includes removing a noise of the second fault type from the second reference map by the second auto-encoder/decoder.

17. The method as claimed in claim 16,
wherein the first pre-processing operation further includes:
expanding an output of the first auto-encoder/decoder based on a first parameter corresponding to the first fault type to generate the one or more first pre-processed reference maps, and
wherein the second pre-processing operation further includes
expanding an output of the second auto-encoder/decoder based on a second parameter corresponding to the second fault type to generate the one or more second pre-processed reference maps.

18. The method as claimed in claim 15, further comprising:
generating a third pre-processed reference map by performing the first pre-processing operation on the target map when the fault type of the target map is classified as the first fault type and by performing the second pre-processing operation on the target map when the fault type of the target map is classified as the second fault type.

* * * * *